(12) United States Patent
Shelnutt et al.

(10) Patent No.: US 10,238,010 B2
(45) Date of Patent: Mar. 19, 2019

(54) RACKMOUNT APPLIANCE FOR SERVER AND RACK LIQUID MANAGEMENT AND WATER CONTROL POLICY EXECUTION

(71) Applicant: DELL PRODUCTS, L.P., Round Rock, TX (US)

(72) Inventors: Austin Michael Shelnutt, Leander, TX (US); Edmond I. Bailey, Cedar Park, TX (US)

(73) Assignee: Dell Products, L.P., Round Rock, TX (US)

(*) Notice: Subject to any disclaimer, the term of this patent is extended or adjusted under 35 U.S.C. 154(b) by 277 days.

(21) Appl. No.: 15/167,968

(22) Filed: May 27, 2016

(65) Prior Publication Data

US 2017/0181328 A1    Jun. 22, 2017

Related U.S. Application Data

(60) Provisional application No. 62/270,563, filed on Dec. 21, 2015, provisional application No. 62/270,584, filed on Dec. 22, 2015, provisional application No. 62/270,574, filed on Dec. 21, 2015, provisional application No. 62/270,575, filed on Dec. 21, 2015, provisional application No. 62/272,061, filed on Dec. 28, 2015.

(51) Int. Cl.
*H05K 7/20* (2006.01)
*G05B 15/02* (2006.01)

(52) U.S. Cl.
CPC ........ *H05K 7/20836* (2013.01); *G05B 15/02* (2013.01); *H05K 7/20781* (2013.01)

(58) Field of Classification Search
CPC .......... H05K 7/20272; H05K 7/20281; H05K 7/20781; H05K 7/20836
See application file for complete search history.

(56) References Cited

U.S. PATENT DOCUMENTS

| | | |
|---|---|---|
| 7,944,694 B2 | 5/2011 | Campbell et al. |
| 9,049,800 B2 | 6/2015 | Shelnutt et al. |
| 9,273,906 B2 | 3/2016 | Goth et al. |
| 9,357,674 B2 | 5/2016 | Campbell et al. |
| 2015/0359139 A1 | 12/2015 | Campbell et al. |
| 2016/0178475 A1* | 6/2016 | Krishnan ........... H05K 7/20836 324/713 |

* cited by examiner

*Primary Examiner* — Marc E Norman
(74) *Attorney, Agent, or Firm* — Isidore PLLC

(57) ABSTRACT

A Rack Information Handling System (RIHS) has more than one liquid cooled (LC) node containing heat-generating functional components, each LC node configured with a system of conduits to receive cooling liquid to regulate the ambient temperature of the node and provide cooling to the functional components inside the node by removing heat generated by the heat-generating functional components. A liquid control subsystem includes electrically-actuated control valves that selectively distribute cooling liquid to LC nodes each comprising a chassis received in a respective chassis-receiving bay of a rack. Liquid sensors detect a parameter of the liquid control subsystem. A liquid controller communicatively coupled to the electrically-actuated control valves and the liquid sensors detect a rack-level liquid event based at least in part on the parameter and communicates to any LC node that is affected by the rack-level liquid event.

23 Claims, 29 Drawing Sheets

RACKMOUNT APPLIANCE FOR SERVER AND RACK LIQUID MANAGEMENT AND WATER CONTROL POLICY EXECUTION

PRIORITY

The present invention claims priority from each of the following provisional patent applications, with relevant content of each listed provisional application incorporated herein by reference: Provisional Application Ser. No. 62/270,563, with filing date Dec. 21, 2015; Provisional Application Ser. No. 62/270,584, with filing date Dec. 22, 2015; Provisional Application Ser. No. 62/270,574, with filing date Dec. 21, 2015, Provisional Application Ser. No. 62/270,575, with filing date Dec. 21, 2015; and Provisional Application Ser. No. 62/272,061, with filing date Dec. 28, 2015.

RELATED APPLICATIONS

The present application is related to the subject matter of co-pending patent application Ser. No. 15/167981, filed on even date herewith. The content of that application is hereby incorporated herein by reference.

BACKGROUND

1. Technical Field

The present disclosure generally relates to information handling systems (IHS), and more particular to a rack-configured IHS, having a liquid cooling subsystem and liquid-cooled nodes. Still more particularly, the disclosure is related to a management of filtration of cooling liquid used in a liquid cooling system of a rack information handling system (RIHS).

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Thus, there is a continuing need for further innovations to provide directed cooling for the individual heat generating components, both at the individual node level, as well as at the larger rack level. When designing the cooling subsystem, consideration must also be given to the different form factors of Information Technology (IT) nodes and rack heights of the RIHS, and the ability to effectively control cooling discretely (at device or node level) and generally across the overall RIHS.

BRIEF SUMMARY

The illustrative embodiments of the present disclosure provides a Rack Information Handling System (RIHS) including a rack having chassis-receiving bays. A liquid control subsystem includes electrically-actuated control valves to selectively distribute cooling liquid that is filtered by a rack filtration unit (RFU) to one or more liquid cooled (LC) nodes. Each node includes a chassis received in a respective chassis-receiving bay of the rack. One or more liquid sensors detect a parameter of the liquid control subsystem. A liquid controller, which can be located in the RFU, is communicatively coupled to the electrically-actuated control valves and to the one or more liquid sensors. The liquid controller determines a rack-level liquid event based at least in part on the parameter. The liquid controller also communicates the determined rack-level event to any LC node that is affected by the rack-level liquid event.

In one or more embodiments, the RFU has a node chassis insertable into the rack of the RIHS. The RFU includes a first filtration subunit that is configured to filter particulates and/or contaminants from the cooling liquid. The RFU also includes a second filtration subunit that is configured to filter particulates and/or contaminants from the cooling liquid. A liquid coolant diversion network diverts liquid flow serially through the first and second filtration subunits. At least one supply port and at least one return port are positioned on an inserted side of the node chassis to seal respectively to a facility supply conduit and a rail supply conduit of a liquid rail for supply liquid transfer.

In one or more embodiments, the RFU has two filter subunits that perform an identical filtration function. Each filtration subunit is individually disengageable from the node chassis for maintenance or replacement, while the other filtration subunit remains engaged in the node chassis and continues liquid filtration. When/while one filtration subunit is removed/disengaged, a liquid coolant diversion network diverts liquid flow to the other filtration subunit for continuous filtration of contaminants and particulates from the cooling liquid received from the facility supply conduit. At least one supply port and at least one return port are positioned on an inserted side of the node chassis to seal respectively to a facility supply conduit and a rail supply conduit of a liquid rail for supply liquid transfer. In an exemplary embodiment, the liquid coolant diversion network is reconfigurable between serial flow and parallel flow of cooling liquid through the first and second filtration subunits.

In another aspect of the present disclosure, a method of managing rack-level liquid cooling events in an RIHS is provided. In one or more embodiments, the method includes electrically-actuating control valves of a liquid control subsystem to selectively distribute cooling liquid to one or more LC nodes. Each node includes a chassis received in a respective chassis-receiving bay of a rack. The cooling liquid is received by a system of conduits of each LC node to respectively regulate the ambient temperature of the LC node and to provide cooling to heat-generating functional components inside the LC node. The method includes detecting, by one or more liquid sensors, a parameter of the liquid control subsystem. The method further includes determining, by a liquid controller, a rack-level liquid event based at least in part on the parameter. The method also includes communicating to any LC node that is affected by the rack-level liquid event.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
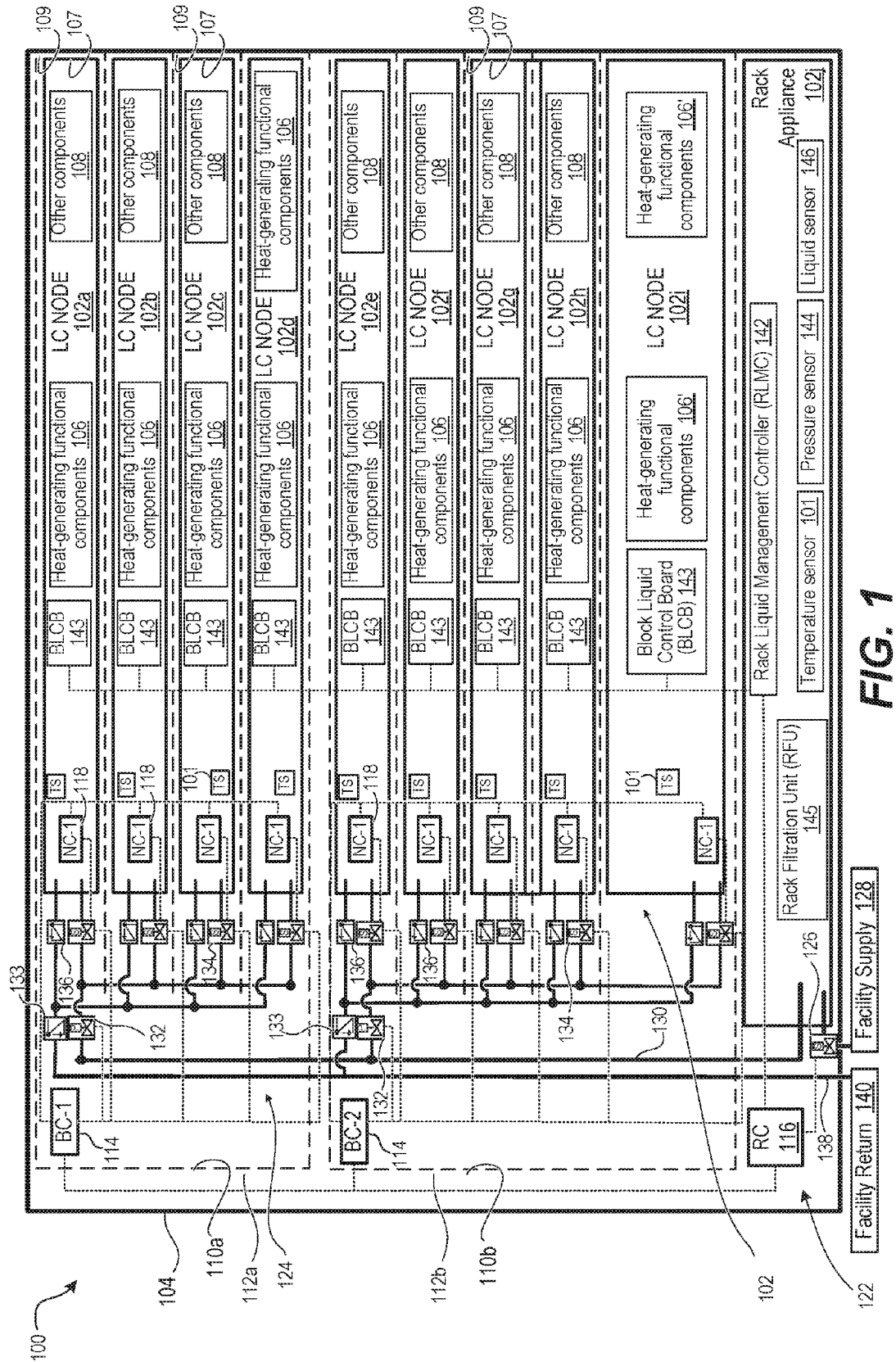
FIG. 1 illustrates a side perspective view of an internal layout/configuration of an example Direct-Interface Liquid-Cooled (DL) RIHS, according to one or more embodiments.

The present disclosure generally provides a rack filtration unit (RFU), which includes a node chassis insertable into a rack of a Rack Information Handling System (RIHS) having a liquid cooling system. Servers are able to closely monitor liquid events that are local to their control plane, but do not have visibility to rack liquid events (water shortage, leaks, etc.) that may impact an individual server's ability to operate in a nominal state. A liquid controller captures extraneous rack-level liquid telemetry, makes decisions upon that data, and passes those decisions down to the servers within the rack so that rack-level events can be handled. A Rack Filtration Unit (RFU) can be a device that is used agnostically amongst rack configurations, can be flexibly located in all server racks for preserving water quality to liquid cooled Information Technology (IT) devices within the rack. RFU can include the liquid controller that passes down rack-level liquid control plane telemetry to connected servers.

In one or more embodiments, the extraneous rack-level liquid telemetry is detection of liquid that has leaked from a liquid cooling (LC) subsystem of the RIHS. The liquid controller can determine rack-level events based at least in part on the detected liquid and communicate this event to affected LC nodes. Such telemetry that arises outside of the LC nodes would otherwise be undetectable by the LC nodes. In addition to such events occurring during normal operation, the liquid controller can perform diagnostic testing or leak testing prior to powering up of the LC nodes. Such testing during start-up can confirm proper installation and performance of the LC subsystem prior to applying electrical power through the RIHS.

In one or more embodiments, the present disclosure further provides a Direct-Interface Liquid-Cooled (DL) RIHS providing LC information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct injection of cooling liquid to regulate the ambient temperature of the node. Additionally, each LC node, configured with a system of conduits, provides cooling to the components inside the node by conductively absorbing, via the cooling liquid, heat generated by the heat-generating functional components. The absorbed heat is removed (or transferred away) from within the node to outside of the node and/or the RIHS. The cooling subsystem has a liquid rail formed by more than one node-to-node, Modular Liquid Distribution (MLD) conduit, which include first and second terminal connections attached on opposite ends of a central conduit. The MLD conduits are rack-unit dimensioned to seal to and enable fluid transfer between a port of a selected LC node and a port of an adjacent LC node.

According to one or more embodiments, the RFU filters physical and chemical impurities from liquid ran through the RFU. The RFU filters incoming liquid received from a facility supply before the liquid is sent through the liquid rail and the rest of the liquid cooling system. The RFU is configured with dual filtration subunits. In one embodiment, first and second filtration subunits can be connected in parallel fluid communication within the node chassis to provide redundancy and continuous operation during replacement. The filtration subunits operate in tandem, with each one capable of operating independently to handle the complete liquid filtration needs of the RIHS. A controller determines and communicates an operating status of a selected one of the first and second filtration subunits based on one or more of the first and second flow rates and the differential pressure value. When prompted for replacement by the controller, each filtration subunit is individually disengageable from the node chassis for maintenance or replacement, while the other filtration subunit remains engaged in the node chassis and continues liquid filtration. The independent operation of the filtration subunits enables continued liquid filtration by a first filtration subunit of incoming liquid from the facility supply, while the second filtration subunit is removed for servicing and/or cleaning and/or replacement. The DL RIHS can thus remain in service, with filtered liquid being provided to and used within the liquid cooling system, during servicing operations on one of the filtration subunits. In one embodiment, a jumper fluid connection can be used to reconfigure the RFU for serial filtering through both filtration subunits, such as for providing different types of filtrations by respective filtration subunits.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a one Rack Unit (1 U) or other height rack space within the rack. A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1 U and two Rack Unit (2 U) increments.

FIG. 1 illustrates a side perspective view of an internal layout/configuration of an example Direct-Interface Liquid-Cooled (DL) RIHS 100 configured with a plurality of LC nodes 102, according to one or more embodiments. For simplicity, the example DL RIHS presented in the various illustrations can be described herein as simply RIHS 100; however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 depicts an illustrative example of LC nodes 102a-102j (collectively refer to as nodes 102), with each nodes 102a-102i including heat-generating functional components 106. Additionally, DL RIHS 100 also includes a rackmount appliance 102j that includes a Rack Filtration Unit (RFU) 145, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct injection of cooling liquid applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110b of a second block 112b. In the illustrative embodiments, the nodes 102 are vertically arranged. In one or more alternate embodiments, at least portions of the nodes 102 (and potentially all of the nodes) may also be arranged horizontally while benefitting from aspects of the present innovation.

The present innovation is not limited to any specific number or configuration of nodes 102 or blocks 112 in a rack 104. According to one aspect, nodes 102 can be of different physical heights of form factors (e.g., 1 U, 1.5 U, 2 U), and the described features can also be applied to nodes 102 having different widths and depths (into the rack), with some extensions made and/or lateral modifications to the placement of cooling subsystem conduits, as needed to accommodate the different physical dimensions. As a specific example, node 102i is depicted as having a larger node enclosure 107' (with corresponding different dimensions of heat-generating functional components 106') of a different number of rack units in physical height (e.g., 2 U) that differs from the heights (e.g., 1 U) of the other nodes 102a-102h and 102j. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, nodes 102 can be individual nodes operating independent of each other, with DL RIHS 100 including at least one rack-level controller (RC) 116 for controlling operational conditions within DL RIHS 100, such as temperature, power consumption, communication, and the like. Each node 102 is then equipped with a node-level controller (NC) 118 that communicates with rack-level controller 116 to provide localized control of the operational conditions of node 102. In the more standard configuration of DL RIHS 100, and in line with the described embodiments, DL RIHS 100 also includes block-level controllers (BCs) 114, communicatively coupled to the rack-level controller 116 and performing block-level control functions for the LC nodes within the specific block. In this configuration, nodes 102 are arranged into blocks 112, with each block 112 having one or more nodes 102 and a corresponding block-level controller 114. Note the blocks do not necessarily include the same number of nodes, and a block can include a single node, in some implementations.

A Direct-Interface Liquid Cooling (DL) subsystem (generally shown as being within the RIHS and labelled herein as 122) provides liquid cooling to heat-generating functional components 106 via a liquid rail 124 under the control of the rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102j before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by a block check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102a-102j and a return conduit 138 of the liquid rail 124 to prevent a backflow into the nodes 102a-102j. The return conduit 138 returns the cooling liquid to a facility return 140.

To support the temperature control aspects of the overall system, RIHS 100 includes temperature sensors 101 that are each located within or proximate to each node 102a-102j, with each temperature sensor 101 connected to the node-level controller 118 and/or the corresponding block-level controller 114. Temperature sensors 101 operate in a feedback control loop of the liquid cooling system 122 to control the amount of liquid flow required to cool the nodes 102a-102j. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Rack Liquid Infrastructure Controller (RLIC) 142 can perform management and operational testing of DL subsystem 122 by communicating with Block Liquid Control Boards (BLCB) 143 respectively for each block 112a-112b or each LC node 102a-102h. RLIC 142 can monitor pressure sensors 144 and liquid sensors 146 to detect a leak, to validate operation of a dynamic control valves 132, 134 or shut-off valves such as supply valve 126. RLIC 142 can perform close-loop control of specific flow rates within the RIHS 100.

Figure 2:
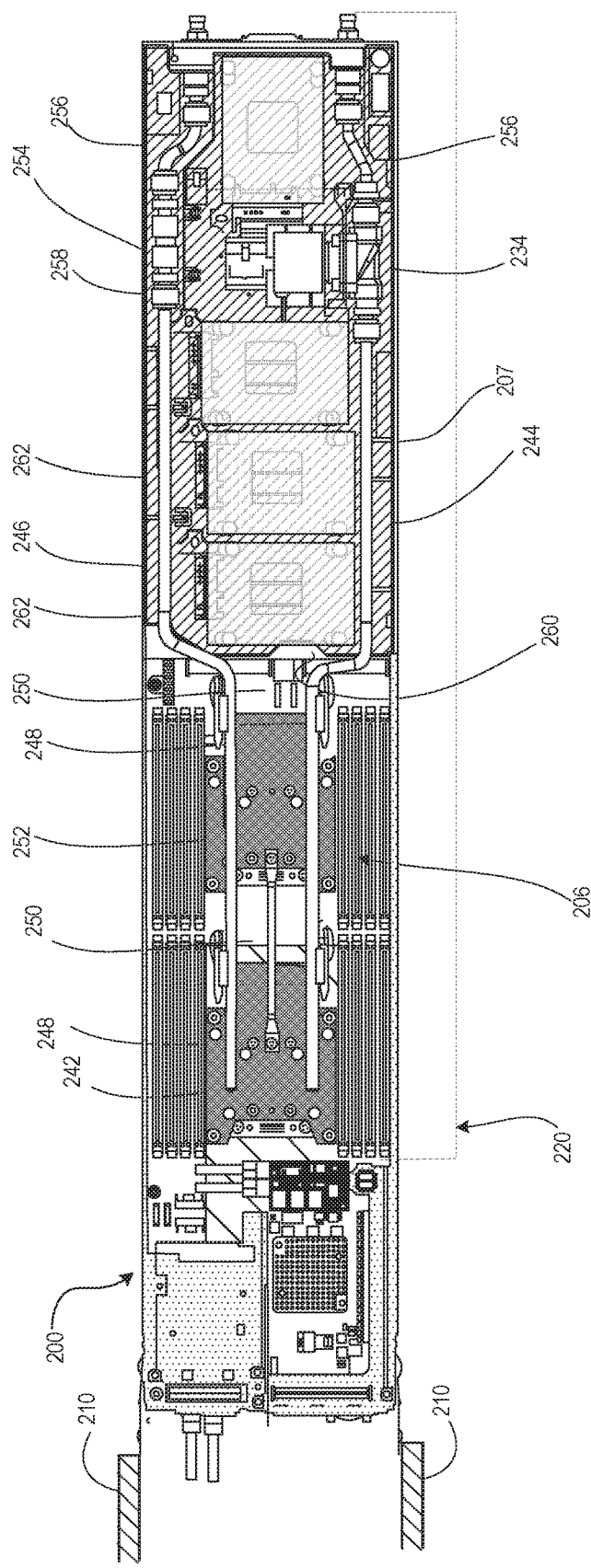
FIG. 2 illustrates a top view of an example LC node configured with a liquid cooling subsystem that includes a liquid-to-liquid manifold and cooling pipes for conductively cooling internal functional components, according to one or more embodiments.

FIG. 2 illustrates an example LC node of example DL RIHS 100 of FIG. 1, LC node 200, having a node enclosure 208 insertable into a block chassis 210. For purposes of description, LC node 200 is a server IHS that includes processing components or central processing units (CPUs), storage devices, and other components. LC node 200 includes cooling subsystem (generally shown and represented as 220) that includes a liquid-to-liquid manifold 242 to cool heat-generating functional components 206 by heat transfer from liquid provided by node-level supply conduit 244, and return conduit 246, according to one or more embodiments. Node-level supply conduit 244 and return conduit 246 are appropriately sized and architecturally placed relative to the other components and the dimensionality (i.e., width, height, and depth/length) of LC node 200 to permit sufficient cooling liquid to pass through the interior of LC the node 200 to remove the required amount of heat from LC node 200 in order to provide appropriate operating conditions (in terms of temperature) for the functional components located within LC node 200. Liquid-to-liquid manifold 242 can include CPU cold plates 248 and voltage regulator cold plates 250. A sled assembly grab handle 252 can be attached between CPU cold plates 248 for lifting LC node 200 out of block chassis 210. A return-side check valve 254 of the return conduit 246 can prevent facility water from back-feeding into LC node 200 such as during a leak event. Flex hose links 256 in each of node-level supply conduit 244 and return conduits 246 can reduce insertion force for sleds into block chassis 210. Sled emergency shutoff device 234 interposed in supply conduit 244 can be a solenoid valve that closes in response to input from a hardware circuit during a sled-level leak detection event. Node-level carrier 258 received in node enclosure 208 can incorporate liquid containment structure 260 to protect storage device 262. In the illustrative example illustrated by FIG. 2, LC node 200 is oriented horizontally and is viewed from above. In one or more embodiments node-level carrier 258 is configured to route leaked cooling liquid away from storage device 262 when oriented vertically.

FIGS. 3-7 illustrate different exterior and rear views of an example assembled DL RIHS 300. DL RIHS 300 includes rack 304, which is a physical support structure having an exterior frame and attached side panels to create cabinet enclosure 364 providing interior chassis receiving bays (not shown) within which a plurality of individual node chasses (or sleds) 208 of functional IT nodes, such as LC node 200 of FIG. 2, are received. In the description of the figures, similar features introduced in an earlier figure are not necessarily described again in the description of the later figures.

Figure 4:
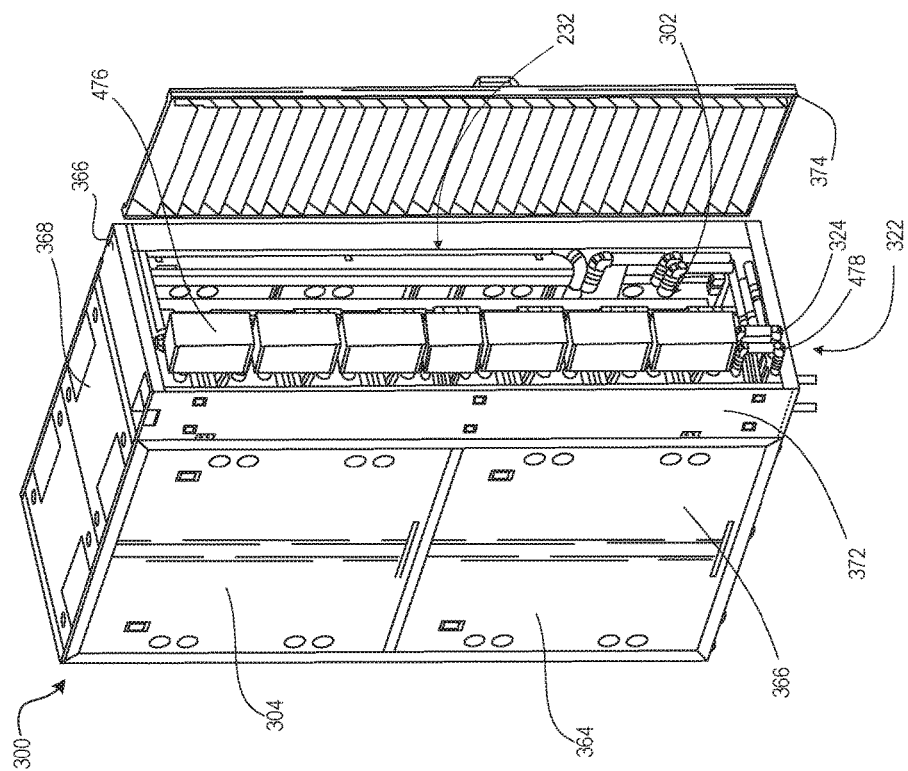
FIGS. 4 and 5 illustrate a rear perspective view of the example DL RIHS of FIG. 3 with the louvered rear door opened to expose node-to-node interconnection of MLD conduits of different vertical sizes having appropriately sized and removable pipe covers, according to one or more embodiments.
Figure 3:
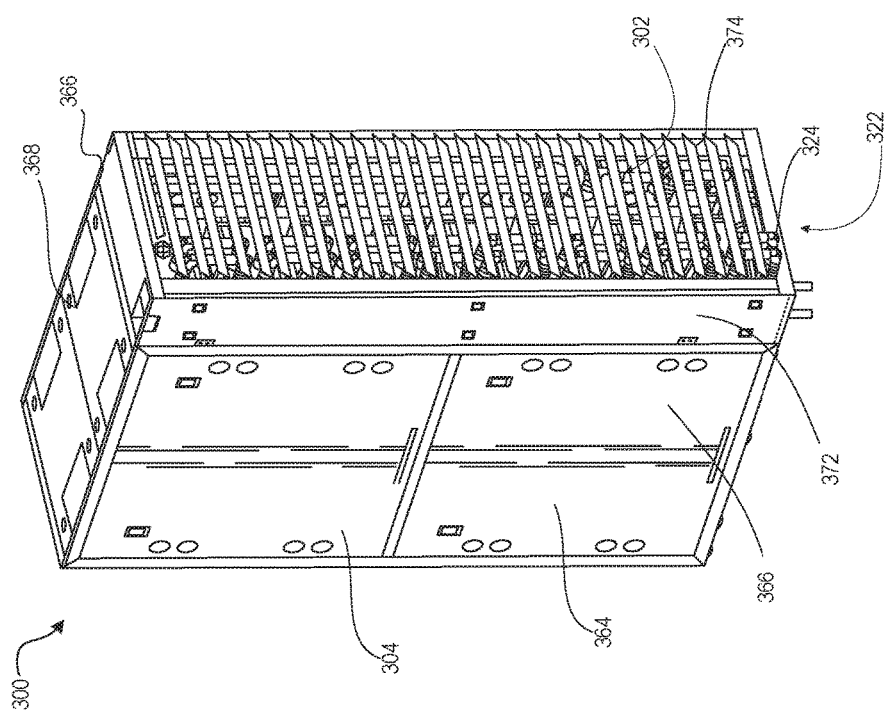
FIG. 3 illustrates a rear perspective view of an example DL RIHS with a louvered rear door in a closed position over uncovered Modular Liquid Distribution (MLD) conduits, according to one or more embodiments.
Figure 5:
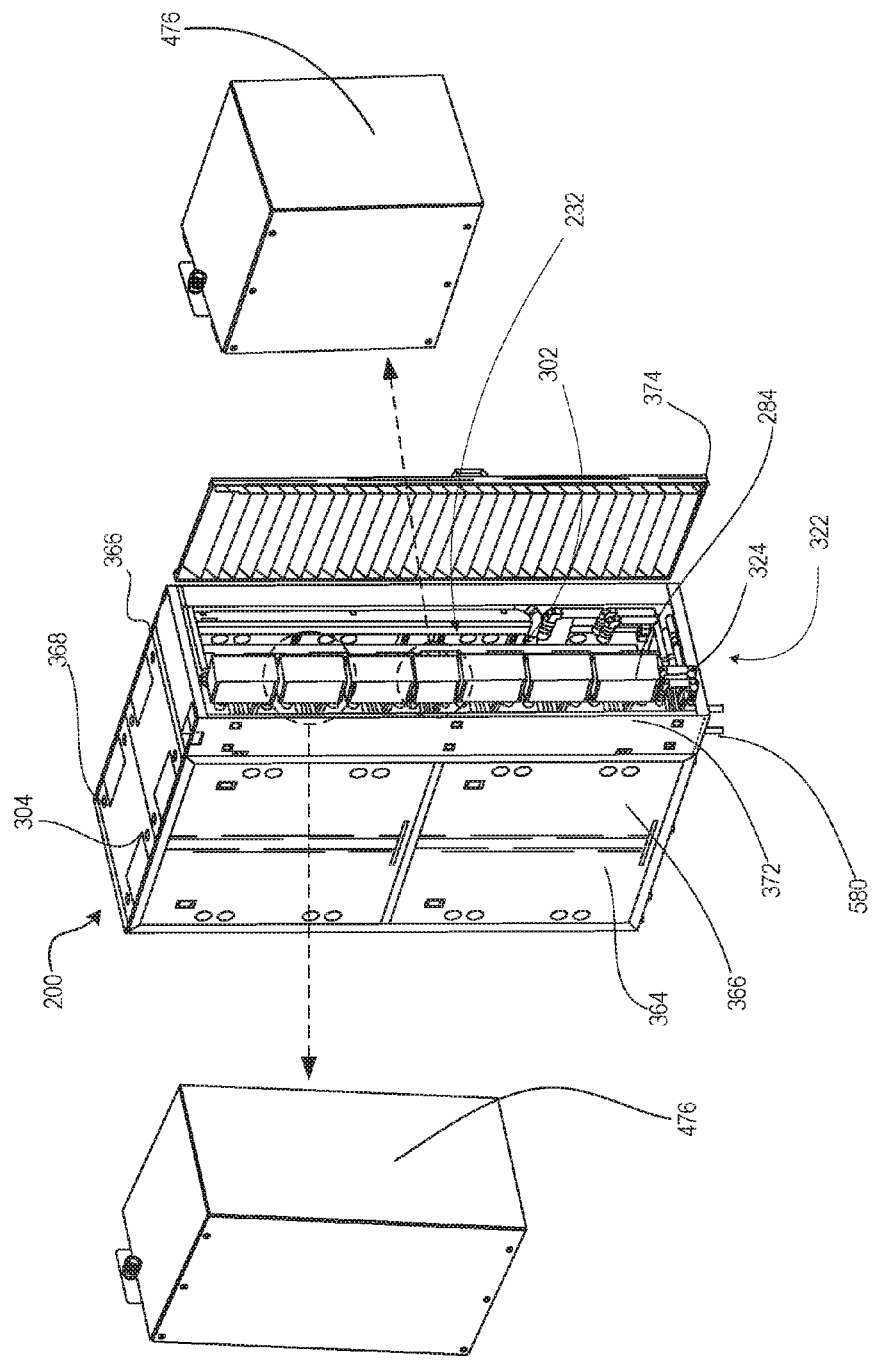

FIGS. 3-5 specifically illustrate exterior views of rack 304 of example DL RIHS 100. Turning now to FIG. 3, rack 304 includes opposing side panels 366, attached to a top panel 368 (and bottom panel—not shown) to create the main cabinet enclosure 364 that includes multiple chassis receiving bays for housing LC nodes 102/200. The created cabinet enclosure 364 includes a front access side (not shown) and a rear side. The front access side provides access to the chassis receiving bays created within the main cabinet enclosure 364 for receiving LC nodes 102 (of FIG. 1) into rack 304. Attached to the rear ends of the main opposing side panels 366 are opposing side panel extensions 372. A louvered rear door 374 is hinged (or otherwise attached) to one of the side panel extensions 372 and includes a latching mechanism for holding the door 374 in a closed position, where in a closed position is relative to the otherwise open space extending laterally between opposing side panel extensions 372. Side panel extensions 372 and louvered rear door 374 provide an extension to main cabinet enclosure 364 for housing, covering/protecting, and providing access to the modular, scalable liquid rail 324 of a liquid cooling subsystem 322 that provides liquid cooling to each LC node 102 (of FIG. 1) inserted into the chassis of the main cabinet enclosure 364.

FIG. 4 illustrates an embodiment in which rear pipe covers 476 can protect portions of liquid rail 324 (of FIG. 3), and specifically Modular Liquid Distribution (MLD) conduits 478, from inadvertent damage as well as containing any leaks from being directed at sensitive functional components 106 (of FIG. 1).

Illustrated in FIG. 5 are rear pipe covers 476 (of FIG. 4) of MLD conduits 478 (of FIG. 4) of liquid rail 324 (of FIG. 3) having different sizes. According to one aspect, the MLD conduits 478 (of FIG. 4) are rack unit dimensioned pipes that form a node-to-node scalable rack liquid manifold ("liquid rail") to distribute cooling liquid, as required, for each node 102 (of FIG. 1) and through the vertical arrangement of nodes 102 (of FIG. 1) within RIHS 100 (of FIG. 1). The MLD conduits 478 are rack unit dimensioned in that a set of incrementally sized length of pipes are attachable as appropriate for various combinations of rack unit dimensioned blocks or nodes. For example, a relatively short MLD conduits 478 can be sized to attach between a stack of two 1 RU nodes. A slightly longer MLD conduits 478 can be sized to attach between a stack of a 1.5 RU and 1 RU blocks. A longer MLD conduits 478 can be sized to attached between a stack of a 2 RU and 2 RU block, etc. In an exemplary embodiment, the cooling liquid is received from a facility supply 128 (of FIG. 1) via below rack (e.g. ground level or below floor) connections 580.

Figure 6:
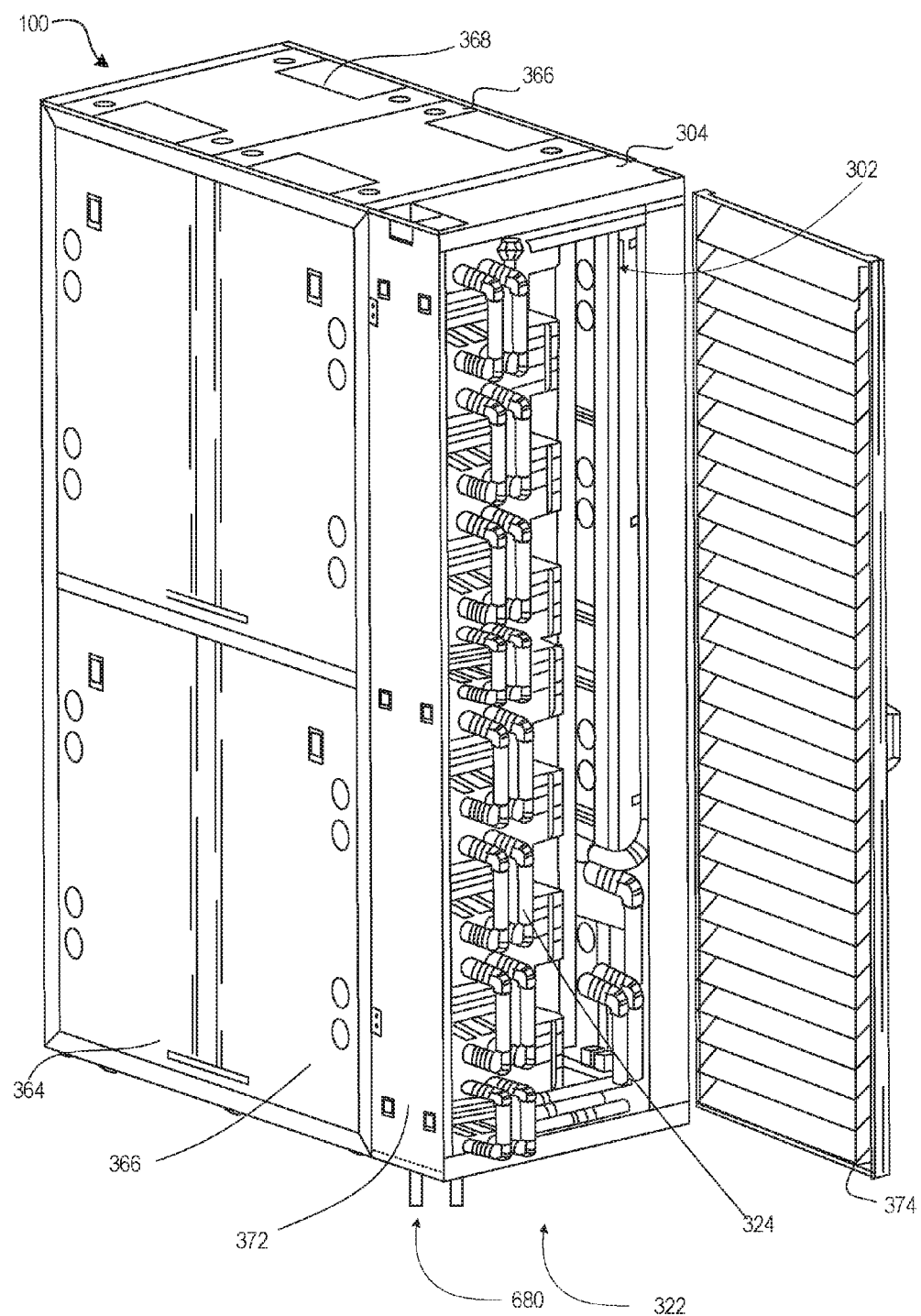
FIG. 6 illustrates the rear perspective view of FIGS. 4-5 with the pipe covers removed to expose the MLD conduits, according to one or more embodiments.

FIG. 6 illustrates an example RIHS 100, as depicted in FIG. 1, with MLD conduits 478 (of FIG. 4), that are uncovered, displaying liquid rail 324 (of FIG. 3). In the embodiment of FIG. 6, cooling liquid is received from a facility supply 128 (FIG. 1) by below rack (e.g. ground level or below floor) connections 680.

Figure 7:
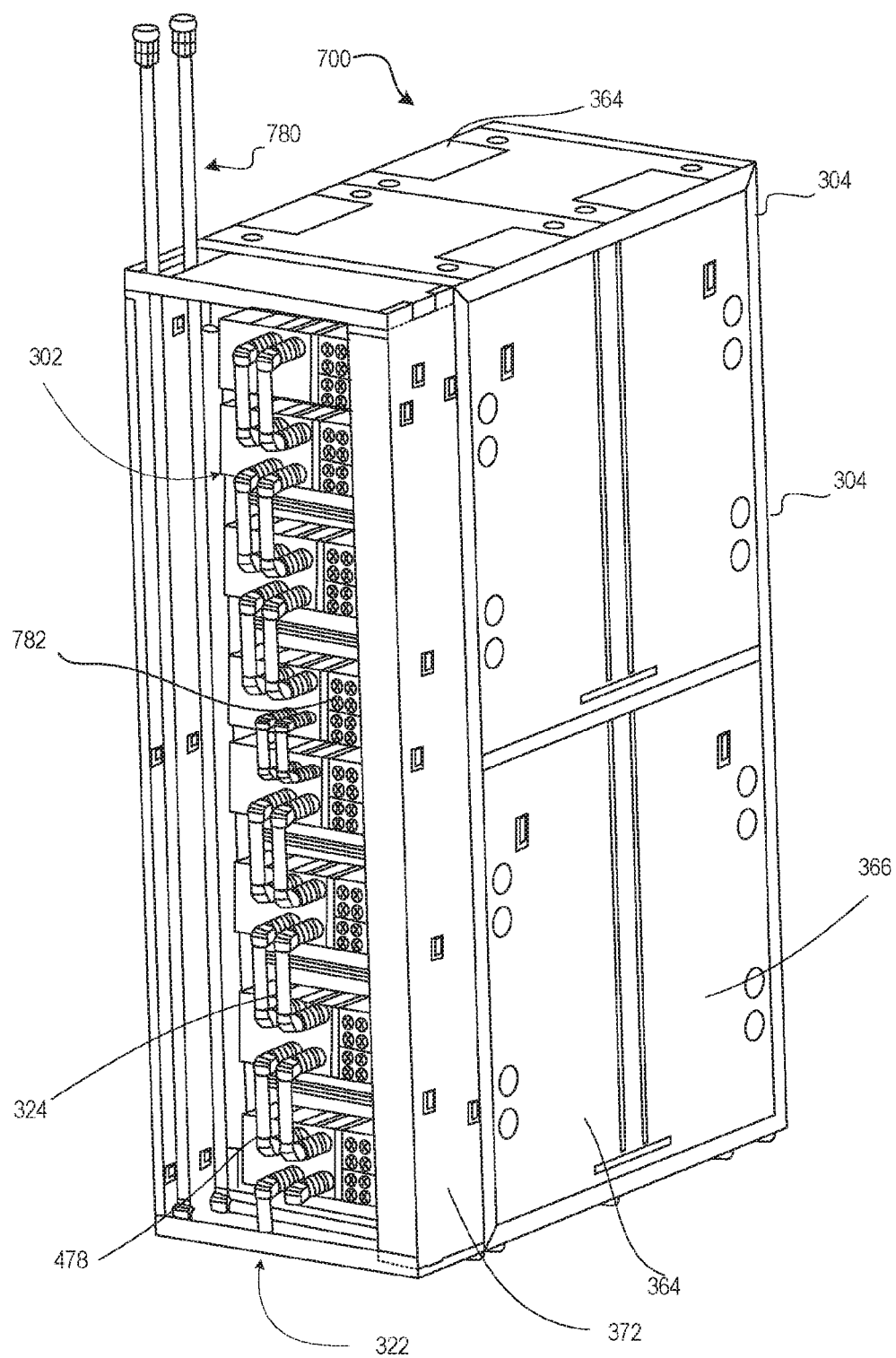
FIG. 7 illustrates a rear perspective view of an example RIHS with MLD conduits in fluid communication with supply side conduits extending from a top of the rack, according to one or more embodiments.

FIG. 7 illustrates a second example RIHS 700, wherein cooling liquid is received from facility supply 128 (FIG. 1) provided by an above-rack (and possibly in ceiling) connections 780. Also shown by FIG. 7 are air movers depicted as fan modules 782 adjacent to the liquid rail. These fan modules 782 are mounted at the back of RIHS 700 to draw air flow through LC nodes 102 providing additional cooling of LC nodes 102, of FIG. 1, (e.g., convection cooling for node components 106, of FIG. 1) that may or may not also receive direct-interface of cooling liquid, in different embodiments.

Figure 8:
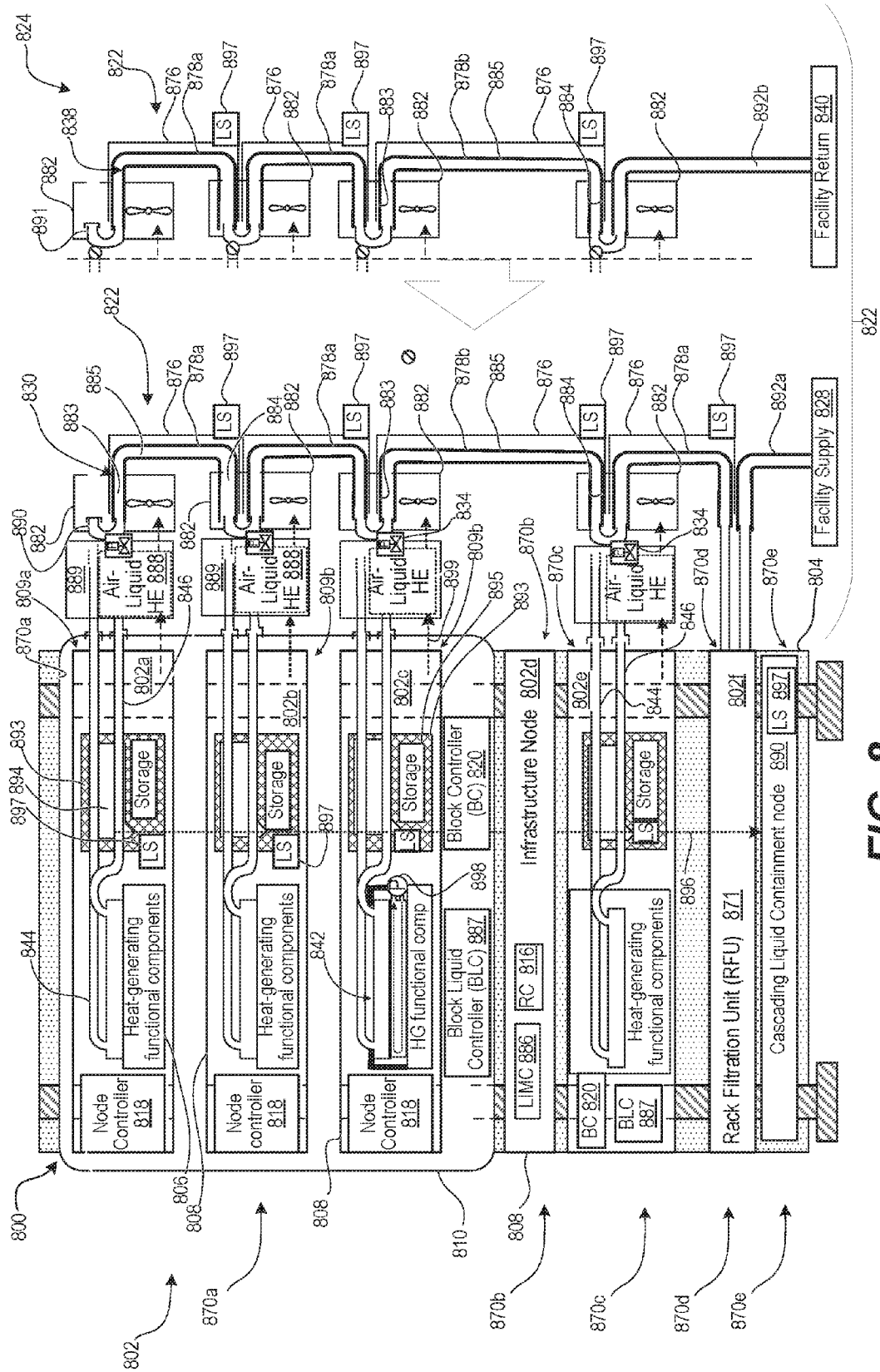
FIG. 8 illustrates a detailed block diagram of a DL RIHS configured with LC nodes arranged in blocks and which are cooled in part by a liquid cooling system having a rail comprised of MLD conduits, and in part by a subsystem of air-liquid heat exchangers, according to multiple embodiments.

FIG. 8 illustrates a more detailed view of the interconnections of the liquid cooling subsystem, at a node level and rack level within an example DL RIHS 800. As shown, RIHS 800 is configured with LC nodes 802a-802e arranged in blocks (e.g., block 1 comprising 802a-802c) and which are cooled in part by a liquid cooling system having a liquid rail comprised of MLD conduits, and in part by a subsystem of air-liquid heat exchangers, can be configured with heat-generating functional components 806 and that are cooled at least in part by a system of MLD conduits 878a-878b, according to one or more embodiments. Illustrated within nodes 802 are heat-generating functional components 806, such as processors, voltage regulators, etc., which emit heat during operation and or when power is applied to the component, such that the ambient temperature increases around the component, and within the node, and eventually within the block, and ultimately DL RIHS 800, during standard operation. To mitigate heat dissipation (and effects thereof), and to maintain the RIHS, block, node, and functional components within proper operating temperatures, DL RIHS 800 is configured with a DL subsystem 822. DL subsystem 822 includes a rack level network of liquid propagating pipes, or conduits that are in fluid communication with individual node level networks of liquid propagating conduits. Additionally, DL subsystem 822 collectively facilitates heat absorption and removal at the component level, the node level, the block level, and/or the rack level.

The rack-level network of conduits includes a modular arrangement of a liquid rail 824 formed by more than one node-to-node MLD conduit 878a-878b spanning (or extending) between LC nodes 802 provisioned in rack 804.

At the top position of RIHS 800, a block chassis 810 is received in a block chassis receiving bay 870a of rack 804. Within block chassis 810, a first node 802a received in a first node receiving bay 809a of the rack 804 has a vertical height of one rack unit (1 U). A second node 802b received in a second node receiving bay 809b of the rack 104 (of FIG. 1) has a vertical height of 1 U. A third node 802c received in a third node receiving bay 809c of the rack 804 has a vertical height of 1 U. A fourth node 802d, infrastructure node 802b, is received in a second block chassis receiving bay 870b of rack 804 and has a vertical height of 1 U. Infrastructure node 802b can contain functional components such as a rack-level controller 816. A fifth node 802e is received in a third chassis receiving bay 870c and has a vertical height of 2 U. A sixth node 802f, which provides a Rack filtration unit (RFU) 871, is received in a fourth block chassis receiving bay 870d of the rack 804. Infrastructure node 802 and RFU 871 are examples of nodes 802 that may not require liquid cooling. A cascading liquid containment unit 890 is received in a fifth chassis receiving bay 870e and includes liquid sensor 897.

MLD conduits 878a of 1 U can be used to connect nodes of 1 U vertical spacing. Because of the additional 1 U separation of LC nodes 802c and 802e by inclusion of infrastructure node 802d, MLD conduit 878b between the third and fifth nodes 802c-802d is dimension 2 U to accommodate the increased spacing. MLD conduits 878a-878b can thus support different heights (1 U to NU) of IT components.

Each MLD conduit 878a-878b includes first terminal connection 883 and second terminal connection 884, attached on opposite ends of central conduit 885. The central conduit 885 portion of the MLD conduit 878a-878b is rack-unit dimensioned to seal to a port of LC node 802 and enable fluid transfer between a port of a selected LC node 802 and a port of an adjacent LC node 802. The MLD conduit 878a-878b provide inter-node connections of the liquid cooling system and are thus sized to bridge the rack unit spacing between adjacent blocks or nodes. Top most and bottom mode blocks or nodes can utilize other conduits. In FIG. 8, facility supply 828 and facility return 840 are respectively located at the intake end of liquid rail 824 and the exhaust end of liquid rail 824. The actual location of facility supply 828 and facility return 840 can be reversed. Alternatively, facility supply 828 and facility return 840 can be located above the RIHS 800 or both conduits can be located on opposite sides of the RIHS 800 in alternate embodiments.

Liquid cooling subsystem 822 includes a liquid infrastructure manager controller (LIMC) 886 which is communicatively coupled to block liquid controllers (BLCs) 887 to collectively control the amount of cooling liquid that flows through the RIHS 800 and ultimately through each of the nodes 802 in order to effect a desired amount of liquid cooling at the component level, node level, block level, and rack level. For clarity, LIMC 886 and BLCs 887 are depicted as separate components. In one or more embodiments, the liquid control features of the LIMC 886 and BLCs 887 can be incorporated into one or more of: rack-level controller 816, block-level controllers 820, and node-level controllers 818. As illustrated in FIG. 1 and previously described, each of LIMC 886 and BLCs 887 are connected to and respectively control the opening and closing of flow control valves that determine the amount of flow rate applied to each block and to each node within the specific block. During cooling operations, one of LIMC 886 and BLC 887 causes a specific amount of liquid to be directly injected into the intake conduits of LC node 802, which forces the cooling liquid through the system of conduits within LC node 802 to the relevant areas and/or functional components/devices inside nodes 802 to absorb and remove heat away from the inside of the node and/or from around the components within the node.

As another aspect, the present disclosure provides a modular approach to utilizing air-to-liquid heat exchanger 888 with quick connection and is scalable in both 1 U and 2 U increments. In one or more embodiments, DL cooling subsystem 822 can include a plurality of air-to-liquid (or liquid-to-air) heat exchangers 888 that facilitate the release of some of the heat absorbed by the exhaust liquid to the surrounding atmosphere around the RIHS 100 (of FIG. 1). Air-to-liquid heat exchangers 888 can be integral to block liquid manifold 889 that, along with the MLD conduits 878a-878b, form scalable liquid rail 824. One aspect of the present disclosure is directed to providing scalable rack-mounted air-to-liquid heat exchanger 888 for targeted heat rejection of rack-mounted equipment to DL cooling subsystem 822. Hot air 899 from auxiliary components, such as storage device 895, would be pushed through the air-to-liquid heat exchanger 888, and the resulting energy would transfer to liquid rail 824 and be rejected to a facility cooling loop, represented by the facility return 840.

RIHS 800 can include variations in LC node 802 that still maintain uniformity in interconnections along liquid rail 824 formed by a chassis-to-chassis modular interconnect system of MLD conduits 878a-878b. With this scalability feature accomplished using MLD conduits 878a-878b, cooling subsystem 822 of the RIHS 800 allows each block chassis 810 to be a section of a scalable manifold, referred herein as liquid rail 824, eliminating the need for a rack manifold. The scalability of liquid rail 824 enables flexible configurations to include various permutations of server and switch gear within the same rack (rack 804). MLD conduits 878a-878b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 834 into each LC node 802 enables each LC node 802 to engage to block liquid manifold 889. Block chassis 810 or node enclosure 808 of each LC node 802 provides the intake and exhaust conduit connections to engage to respective terminals of MLD conduits 878 a-878b within the MLD network provided by liquid rail 824. For example, where nodes 802 are designed as sleds, node enclosure 808 would be a sled tray, and each block would then include more than one sled tray received into block chassis 810, forming the extensions of block liquid manifold 889. Alternatively, the node enclosure 808 can be a single node chassis such as one of nodes 802c-802f.

Supply and return bypass tubes 890, 891 of each block liquid manifold 889 are connected by MLD conduits 878a-878b to form supply rail conduit 830 and return rail conduit 838. Due to constraints in the spacing within the figure, the tubing that extends from supply and return bypass tubes 890, 891 are not shown, and the valves are shown as if connected directly to the bypass. FIG. 9 provides a more accurate view of this features of the disclosure, with conduits extended into the respective supply and return valves at each block. Also, for clarity, FIG. 8 illustrates the return rail conduit 838 separately. Liquid rail 824 enables multiple types of devices to be coupled together, each receiving an appropriately controlled portion of cooling liquid capacity. In one embodiment, liquid cooling subsystem 822 is passively pressurized by attaching MLD supply conduit 892a to facility supply 828 and an MLD return conduit 892b to facility return 840. Liquid flow from supply rail conduit 830 to return rail conduit 838 of liquid rail 824 can be controlled based upon factors such as a temperature of the liquid coolant, detected temperature within LC nodes 802, air temperature inside or outside of DL RIHS 800, etc.

In an exemplary embodiment, the scalable rack manifold provided by liquid rail 824 is formed in part by MLD conduits 878a-878b that run vertically in the back of the RIHS 800 with quick disconnects on the front and rear face of block liquid manifold 889 that allows for IT/infrastructure equipment respectively to be plugged into both front and back sides of the block liquid manifold 889. For example, LC nodes 802, such as server modules, can plug into the front side and fan modules 882 can plug onto the back side of block liquid manifold 889. This also allows for other liquid cooled devices such as LC Power Distribution Units (PDUs) to be plugged into the cooling liquid supply rail conduit 830 and return rail conduit 838 of liquid rail 824. Thereby, a rack hot pluggable cooling interface is created for any rack-mounted equipment.

Cooling subsystem 822 can support an embedded liquid-to-liquid heat exchanger manifold 842, such as in LC node 802c. Node liquid-to-liquid heat exchangers are provided for rejecting heat from one fluid source to a secondary source and do not require vertical chassis space. Additionally, the node liquid-to-liquid heat exchangers do not require a central distribution unit (CDU), which takes up datacenter floor space. One aspect of the present disclosure provides embedded heat exchanger manifold 842 having a common heat transfer plate and a shared bulk header to create a combined liquid distribution manifold that includes a secondary liquid coolant for absorbing heat through the shared bulk header. In particular, the combined embedded heat exchanger manifold 842 rejects heat within shared node enclosure 808 such as node 802c to a secondary liquid coolant. Internal node supply 844 and return conduits 846 of a manifold built on top of a heat exchanger core allow heat transport within manifold 842. In one embodiment, closed system pump 898 can use a first coolant to cool a high thermal energy generating functional component such as a CPU or voltage regulator.

Additionally, the liquid cooling subsystem 822 also includes a filtration system or RFU 871, which prevents chemical impurities and particulates from clogging or otherwise damaging the conduits as the fluid passes through the network of conduits. According to one aspect of the disclosure, liquid cooling subsystem 822 provides RFU 871 in fluid connection with the intake pipes from facility supply 828. In at least one embodiment, RFU 871 includes a sequenced arrangement of liquid filters within a full-sized sled that can be removably inserted by an end user into one of the receiving slots of rack 804. In one embodiment, the RFU 871 is located on an infrastructure sled having rack-level controllers and other rack-level functional components. In at least one embodiment, the entirety of the sled is filed with components associated with RFU 871. Thus, it is appreciated that RFU 871 may occupy the entire area of one vertical slot/position within the chassis. Alternate locations of RFU 871 can also be provided, in different embodiments, with an ideal location presenting the intake port of the RFU 871 in close proximity to a connection to facility supply 828 to directly receive the facility supply 828 prior to the liquid being passed into the remainder of the conduits of the liquid cooling subsystem 822. In one or more embodiments, with appropriately assigned liquid cooling capacity, the system can complete all heat exchange within the rack. Thereby, sealing of the rack becomes feasible to reduce and/or remove any requirements for filtration and/or allocation of rack space for RFU 871.

Liquid cooled compute systems use the high heat transport capacity of water. In one or more embodiments to mitigate risks due to leaking of the water, as one design feature, node-level carrier 893 can include a trench/gutter system for use as liquid containment structure 894. The gutter system can also incorporate an absorbent material that can accumulate sufficient amounts of liquid from small leaks to enable external sensing of the leak. Advantageously, the carrier 893 can also be thermally conductive to serve as a heat sink for components such as storage devices 895. In one embodiment, another leak detection solution that can be incorporated into the LC node 802 involves use of a solenoid to create an event when additional current is applied, due to water pooling around the solenoid. Barriers on carrier 893 can be specifically designed to contain a liquid leak and assist in funneling the liquid through the gutter system. Liquid rail 824 can also be provided with leak containment and detection. In one or more embodiments, removable pipe covers 876 are sized to be mounted around respective MLD conduits 878 a-878b and can include liquid sensors 897 for automatic alerts and shutdown measures.

In one or more embodiments, DL RIHS 800 further incorporates a node-level liquid containment structure 890 with a cascading drain runoff tubing network 896 to a rack-level cascading liquid containment structure 894. In one or more embodiments, the DL RIHS 800 further incorporates leak detection response such as partial or complete automated emergency shutdown. Liquid sensors (LS) 897 at various cascade levels can identify affected portions of DL RIHS 800. Containment and automatic shutoff can address the risks associated with a leak developing in the DL cooling system 822.

Figure 9A:
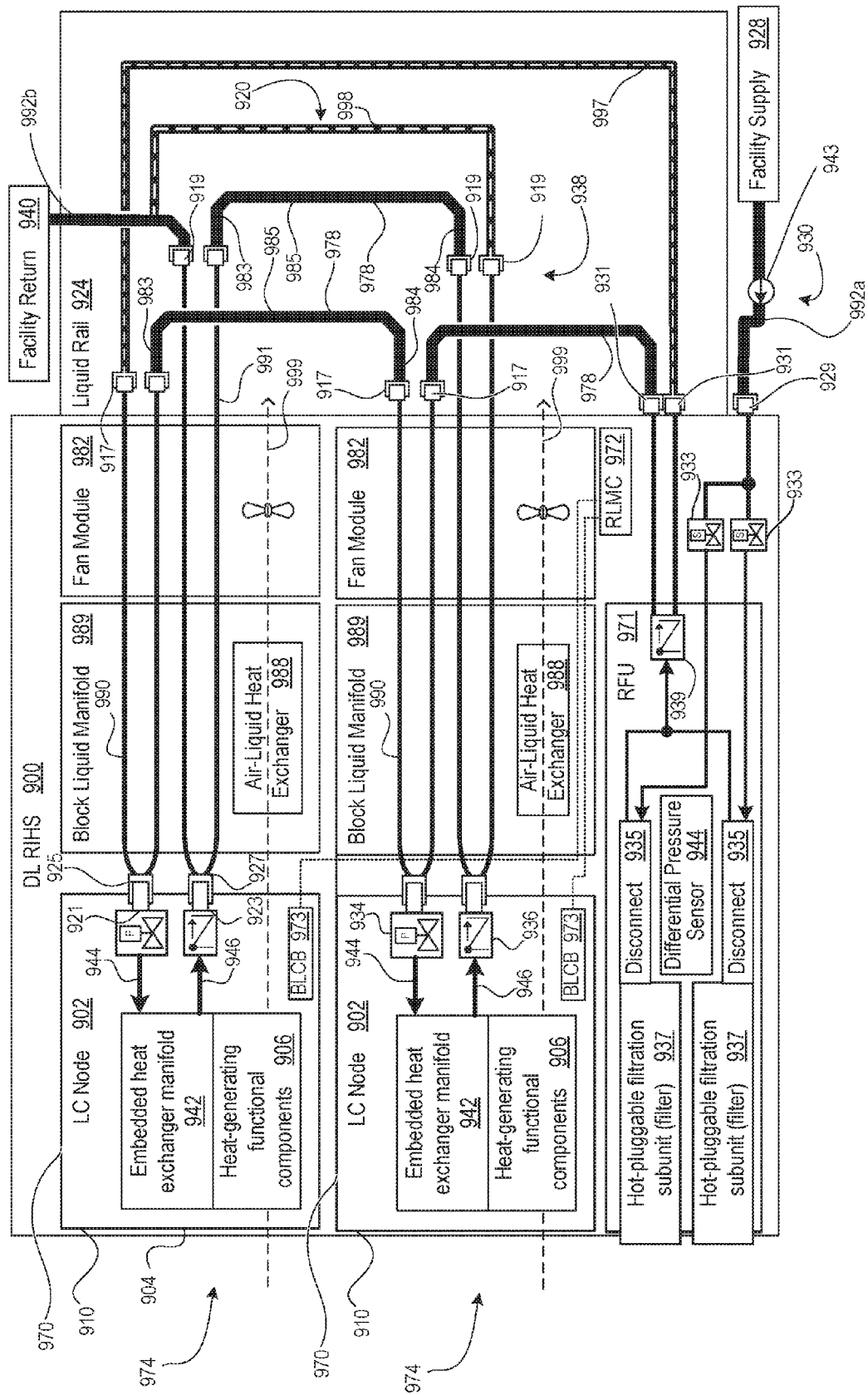
FIG. 9A illustrates an expanded, more detailed view of the liquid interconnection between the node level heat exchange manifold, the block liquid manifold containing the air-liquid heat exchanger, and example MLDs of the liquid rail, according to multiple embodiments.

FIG. 9A illustrates a more detailed view of DL subsystem 920 associated with example DL RIHS 900. Within DL RIHS 900, each LC node 902 includes chassis 910 received in a respective chassis-receiving bay 970 of rack 904. Each LC node 902 contains heat-generating functional components 906. Each LC node 902 is configured with a system of internal supply conduit 944 and return conduit 946, associated with embedded heat exchanger manifold 942. Embedded heat exchanger manifold 942 receives direct injection of cooling liquid to regulate the ambient temperature of LC node 902. A node-level dynamic control valve 934 and node-level return check valve 936 control an amount of normal flow and provide shutoff and/or otherwise mitigate a leak. Cooling subsystem 920 provides cooling to heat-generating functional components 906 inside the LC node 902 by removing heat generated by heat-generating functional components 906. Liquid rail 924 is formed from more than one node-to-node MLD conduit 978 between more than one LC node 902 within rack 904. MLD conduits 978 includes first terminal connection 983 and second terminal connection 984. First terminal connection 983 and second terminal connection 984 are attached on opposite ends of central conduit 985. Central conduit 985 is rack-unit dimensioned to directly mate and seal to and enable fluid transfer between a selected pair of rail supply ports 917 and/or rail return ports 919 of a selected LC node 902 and an adjacent LC node 902.

The cooling subsystem 920 includes block liquid manifolds 989 mountable at a back side of rack 904. Each block liquid manifold has at least one rail supply port 917 and at least one rail return port 919 on an outside facing side of the block liquid manifold 989. The at least one rail supply port 917 and the at least one rail return port 919 respectively communicate with at least one block supply port 921 and a block return port 923 on an inside facing side of the block liquid manifold 989. LC nodes 902 are insertable in receiving bays 970 of rack 904 corresponding to locations of the mounted block liquid manifolds 989. Block supply ports 921 and block return ports 923 of LC nodes 902 and an inside facing portion of the corresponding block liquid manifold 989 are linearly aligned. The linear alignment enables direct sealing, for fluid transfer, of the lineally aligned inside manifold supply ports 925 and return ports 927 to the inside facing portion of the block liquid manifold 989. In one or more embodiments, block supply port 921 sealed to the internal manifold supply port 925 communicates via supply bypass tube 990 to two rail supply ports 917. Block return port 923 sealed to internal manifold return port 927 communicates via return bypass tube 991 of the respective block liquid manifold 989 to two rail return ports 919. Fan modules 982 mounted respectively onto back of block liquid manifold 989 have apertures to expose rail supply 917 and return ports 919. Additionally, fan modules 982 draw hot air 999 from LC nodes 902 through an air-liquid heat exchanger 988 in block liquid manifold 989.

In one or more embodiments, supply liquid conduit 992a is attached for fluid transfer between facility supply 928 and rail supply port 917 of block liquid manifold 989 of RIHS 900. A return liquid conduit 992b can be attached for fluid transfer between rail return port 919 of block liquid manifold 989 to facility return 940. FIG. 9A further illustrates that the fluid connection to facility supply 928 includes RFU 971. To prevent contamination or damage to cooling subsystem 920, RFU 971 is received in bay 970 of rack 904 and includes input port 929 connected via supply liquid conduit 992a to facility supply 928. The RFU 971 includes output port 931 that is connected to MLD conduit 978 of supply rail conduit 930. Liquid rail 924 also includes return rail conduit 938. RFU 971 has a Rack Liquid Management Controller (RLMC) 972 that controls two external emergency shutoff valves 933 for flow received from the input port 929 that is provided via hot-pluggable disconnects 935 to respective replaceable filtration subunits ("filters") 937. RLMC 972 is also communicatively coupled to BLCB 973 for each respective block 974. The separation of the intake fluid across dual shutoff valves 933 and filters 937 enables the supply of cooling liquid to continue even when one of the filters is removed or clogged up (preventing the passage of cooling liquid) and/or one of the shutoff valves 933 is closed off. The cooling liquid flows in parallel to two replaceable filtration subunits 937, automatically diverting to the other when one is removed for cleaning or replacement. Thereby, filtration and cooling of RIHS 900 can be continuous even while servicing one of filters 937. Back-flow is prevented by check valve 939 that allows normal flow to exit to output port 931. Differential pressure sensor 944 measures the pressure drop across filters") 937 and provides an electrical signal proportional to the differential pressure. According to one aspect, Rack Liquid Infrastructure Controller (RLIC) 942 can determine that one filter 937 is clogged if the differential pressure received from differential pressure sensor 944 falls below a pre-determined value.

In one or more embodiments, RIHS 900 can provide hot-pluggable server-level liquid cooling, an integrated leak collection and detection trough, and an automatic emergency shut-off circuit. At a block level, RIHS 900 can provide embedded air-to-liquid heat exchange, and dynamic liquid flow control. At a rack level, RIHS 900 can provide facility-direct coolant delivery, a scalable rack fluid network, a rack filtration subunit, and automated rack flow balancing, and a service mode.

According to one embodiment, liquid rail 924 includes a series of secondary conduits, such as supply divert conduit 997 and return divert conduit 998 that provides a by-pass fluid path for each of MLD conduits 978. In operation, divert conduit 997 allows for the removal of corresponding MLD conduit 978, thus removing the flow of cooling liquid to the particular block of nodes, without interrupting the flow of cooling liquid to the other surrounding blocks of computer gear. For example, a particular MLD conduit 978 can be replaced due to a leak. For another example, a block liquid manifold 989 can be replaced. The inclusion of divert conduits 997, 998 thus enables rapid servicing and maintenance of block liquid manifold 989 and/or nodes within block chassis without having to reconfigure the MLD conduits 978. In addition, RIHS 900 can continue operating as cooling liquid continues to be provided to the remainder of the blocks that are plugged into the liquid rail. Re-insertion of the MLD conduit 978 then reconnects the flow of cooling liquid to the block for normal cooling operations, and shuts off the diverted flow of cooling liquid. In an exemplary embodiment, the MLD conduits 978 provide a quick disconnect feature that interrupts flow when not fully engaged to a respective port 917, 919, 921, 923. Disconnection of an MLD conduit 978 interrupts flow in a primary portion of the liquid rail 924 for either supply or return, shifting flow through one or more divert conduits 997 to provide cooling liquid to the other block liquid manifolds 989. In one or more embodiments, a manual or active shutoff valve can interrupt flow on either or both of the primary or divert portions of the liquid rail 924.

Figure 9B:
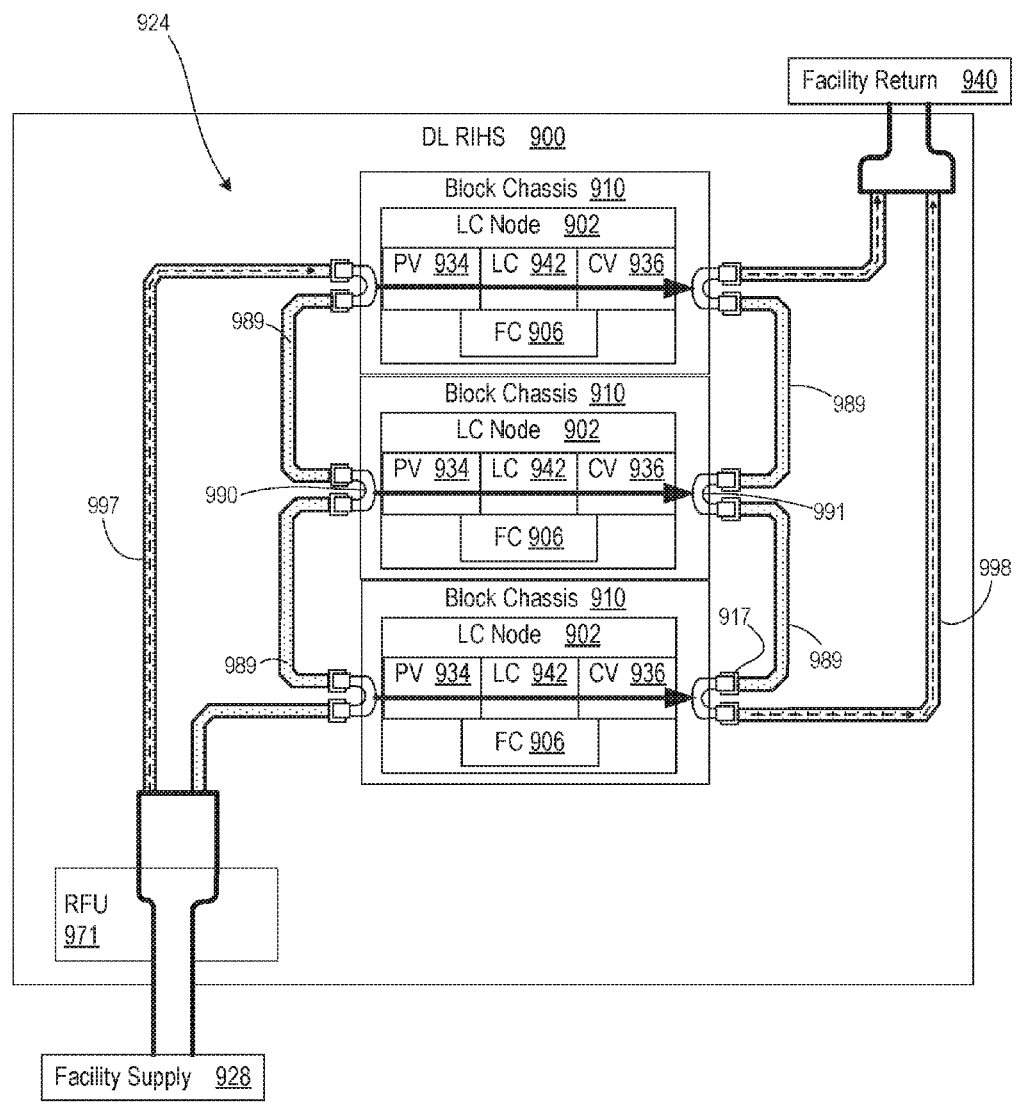
FIG. 9B illustrates a functional block diagram of an example DL RIHS having three LC nodes cooled by a liquid rail of MLD conduits and supply and return divert conduits, according to one or more embodiments.
Figure 9C:
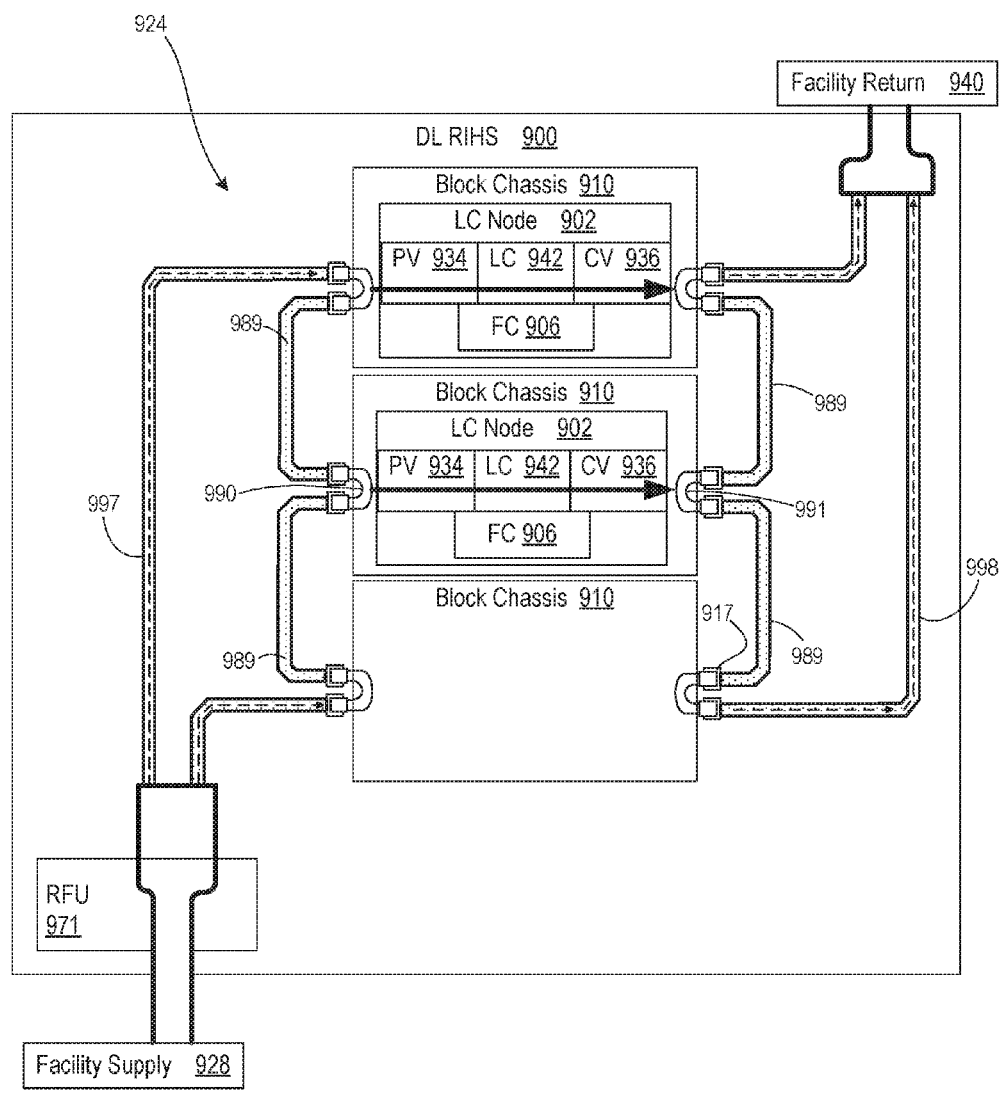
FIG. 9C illustrates a functional block diagram of the example DL RIHS of FIG. 9B having an LC node removed, according to one or more embodiments.
Figure 9D:
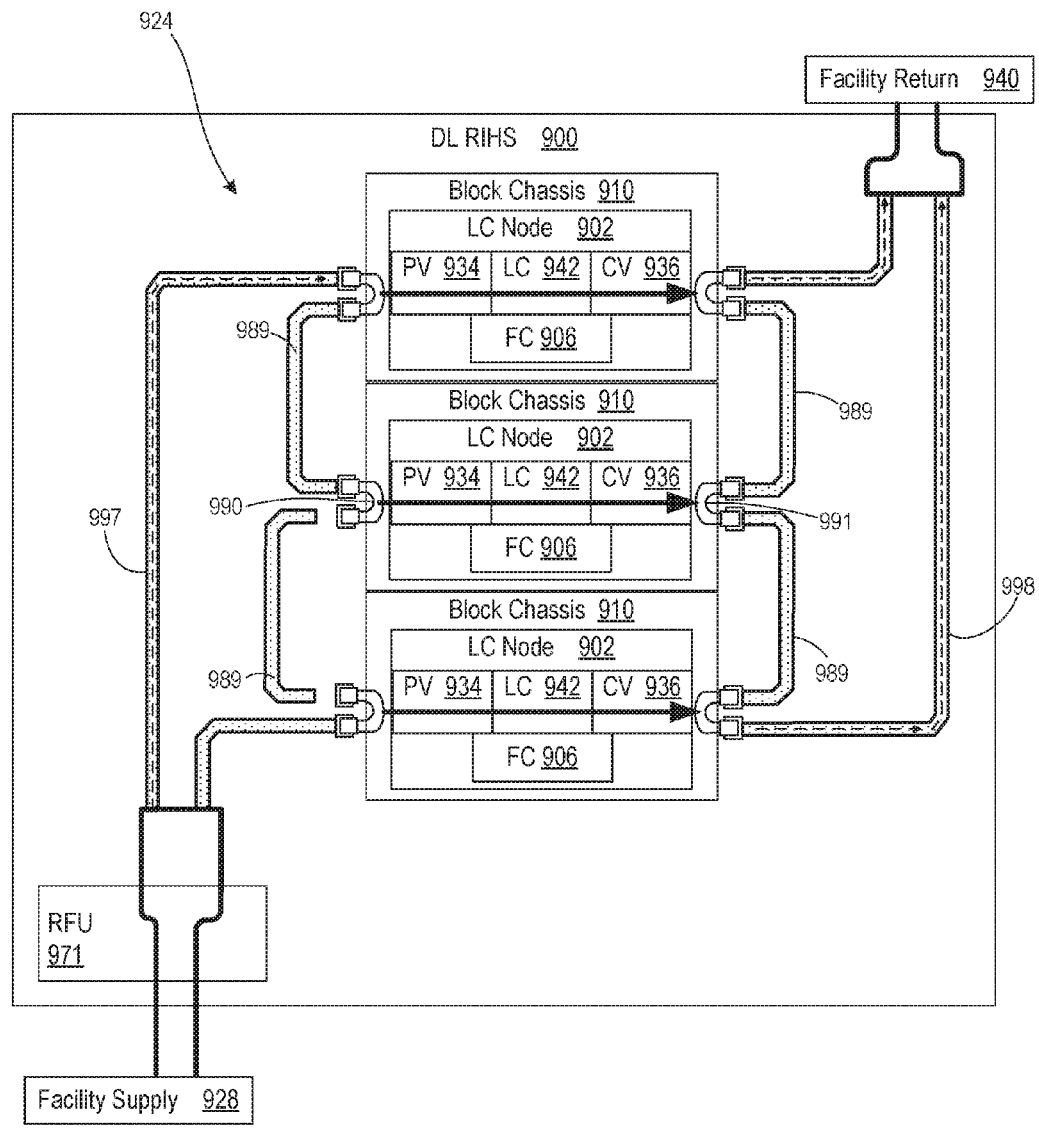
FIG. 9D illustrates a functional block diagram of the example of DL RIHS of FIG. 9B with a supply and a return MLD conduit removed, according to one or more embodiments.
Figure 9E:
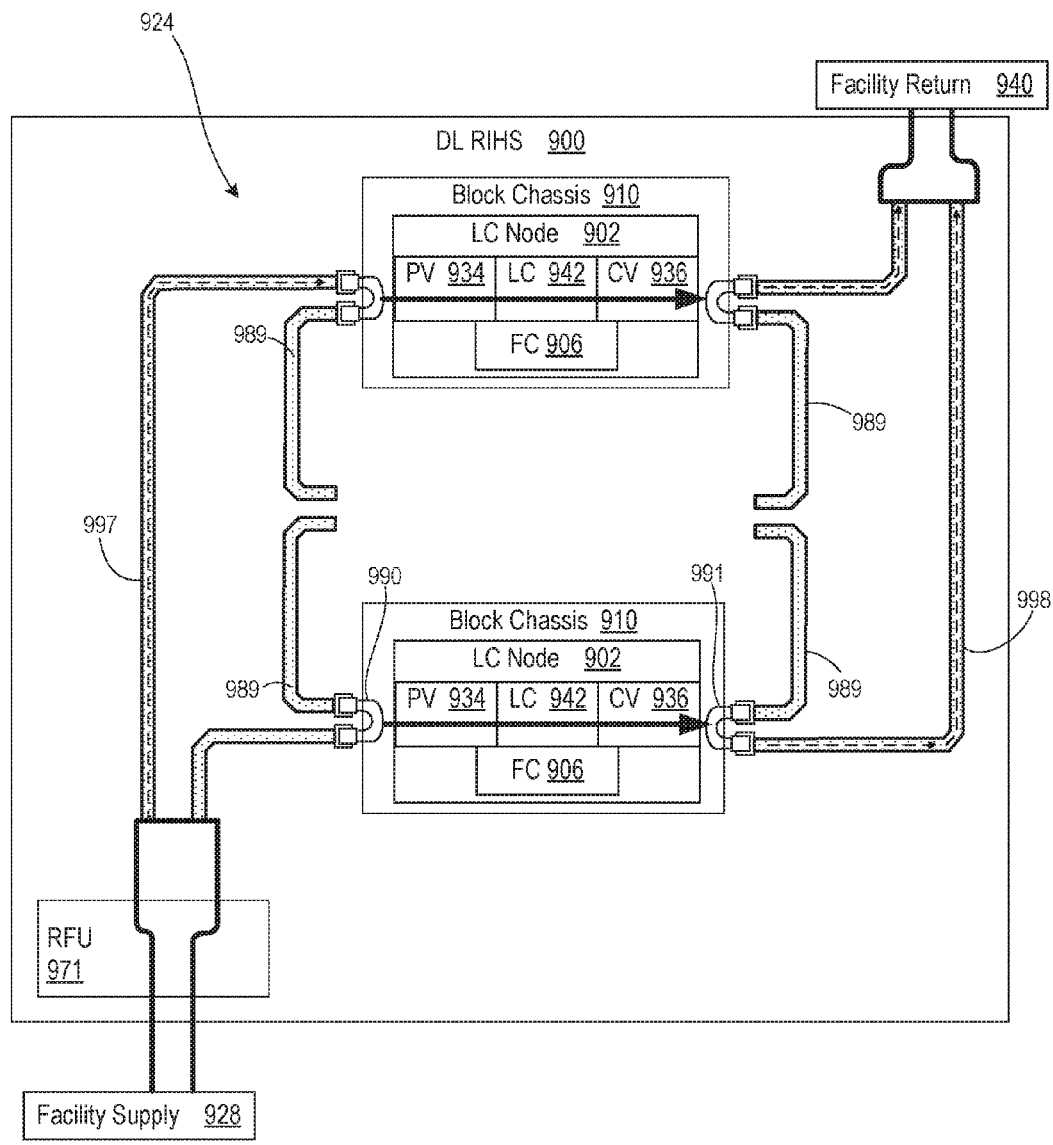
FIG. 9E illustrates a functional block diagram of the example of DL RIHS of FIG. 9B with a block chassis and LC node removed, according to one or more embodiments.

FIG. 9B illustrates the DL RIHS 900 having three block chasses 910, each having a block liquid manifold 989 represented by a supply bypass tube 990 and a return bypass tube 991. For clarity, a single LC node 902 is received in a respective block chassis 910. A dynamic control valve, such as a proportional valve (PV) 934, controls an amount of cooling liquid flow that is directed through an LC heat-exchange component 942 to cool a functional component (FC) 906. The warmed cooling liquid flow passes through a check valve (CV) 936 to join a bypass flow in the respective return bypass tube 991. An LC subsystem 920 provides the cooling liquid flow. Supply and divert conduits 997 and 998 are not required to handle the flow in this nominal case with a complete liquid rail 924. FIG. 9C illustrates one LC node 920 removed. The empty block chassis 910 provides routine bypass flow through the supply and return bypass tubes 990 and 991 as part of the primary flow path. The supply and divert conduits 997 and 998 are not required to handle the flow in a secondary path. FIG. 9D illustrates a supply MLD conduit 989 and a return MLD conduit 989 removed for replacement. The primary flow path is interrupted by removal of the MLD conduits 989. The supply and return divert conduits 997 and 998 provide a secondary flow path to block chassis 910 that are downstream of the removed MLD conduits 989. The LC node 920 that remains in the affected block chassis 910 continues to receive cooling liquid and can continue full operation. FIG. 9E illustrates removal of a block chassis 910. The supply and return divert conduits 997 and 998 provide a secondary flow path to provide cooling liquid flow to the remaining block chasses 910.

Figure 10A:
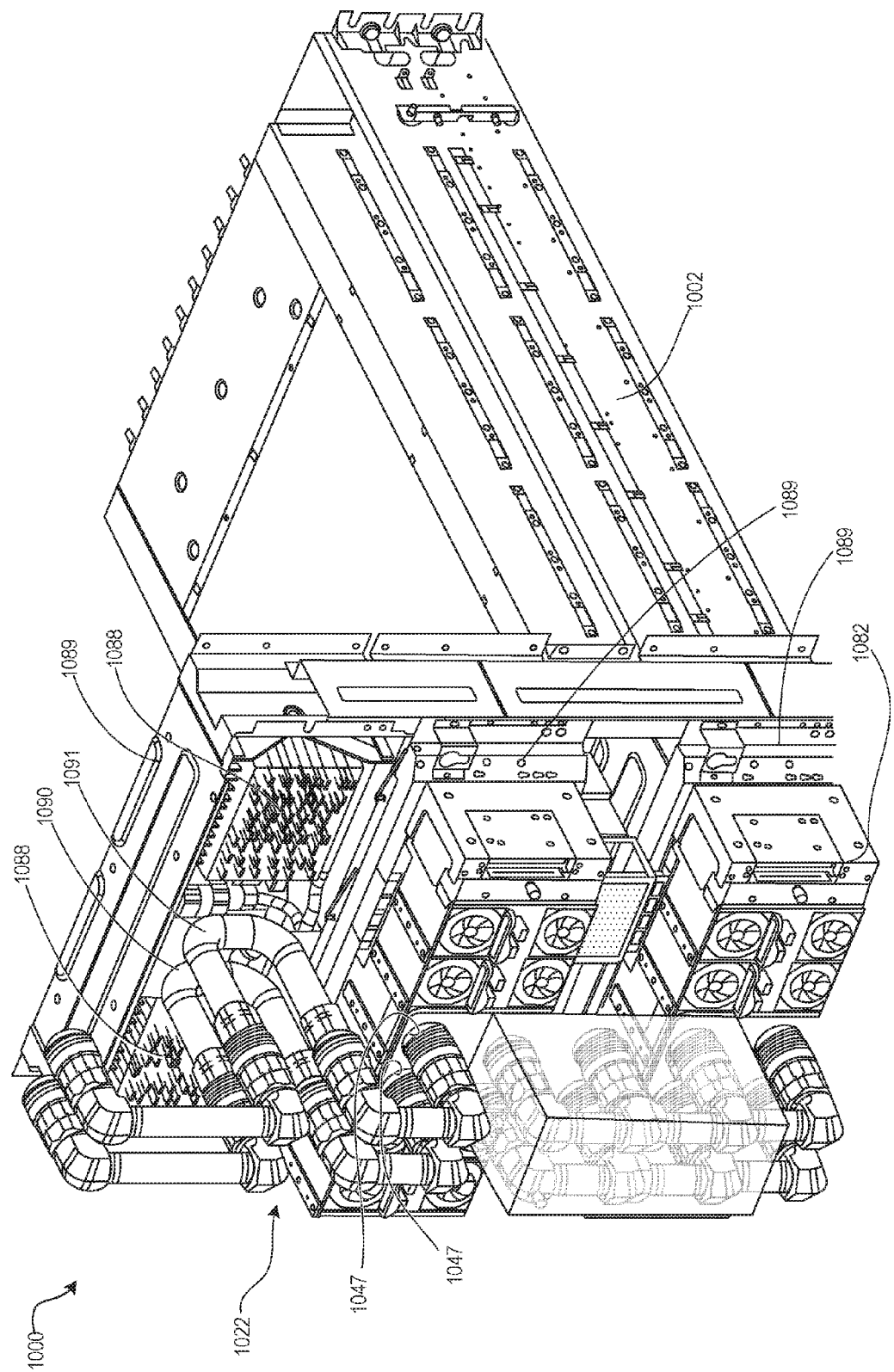
FIG. 10A illustrates a perspective view of a portion of a DL RIHS depicting example nodes, block radiators with Air-Liquid heat exchangers, and MLD conduits, according to one or more embodiments.

FIG. 10A illustrates a more detailed view of the internal makeup of the rails and other functional components of the cooling subsystem 1022 of example DL RIHS 1000. According to one embodiment, cooling subsystem 1022 also includes air movers and/or other devices to provide for forced air cooling in addition to the direct injection liquid cooling. As shown by FIG. 10A, at least one fan module 1082 is rear mounted to a block liquid manifold 1089 in which an air-to-liquid heat exchanger (or radiator) 1088 is incorporated. Fan module 1082 provides air movement through Chassis 1010 and/or node enclosure 1008 of node 1002 as well as through air-to-liquid heat exchanger 1088. Each block liquid manifold 1089 includes supply bypass tube 1090 and return bypass tube 1091 through which a dynamically determined amount of cooling liquid is directed into the respective node 1002 while allowing a bypass flow to proceed to the next node(s) 1002 in fluid path of the intake flow. Fan module 1082 includes apertures 1047 through which the supply and return bypass tubes 1090 and1091 are extended, in one embodiment. Nodes 1002 are connected into the back side of the block liquid manifold with the ends of intake and exhaust liquid transfer conduits in sealed fluid connection with bypass tubes 1090 and 1091 respectively.

Figure 10B:
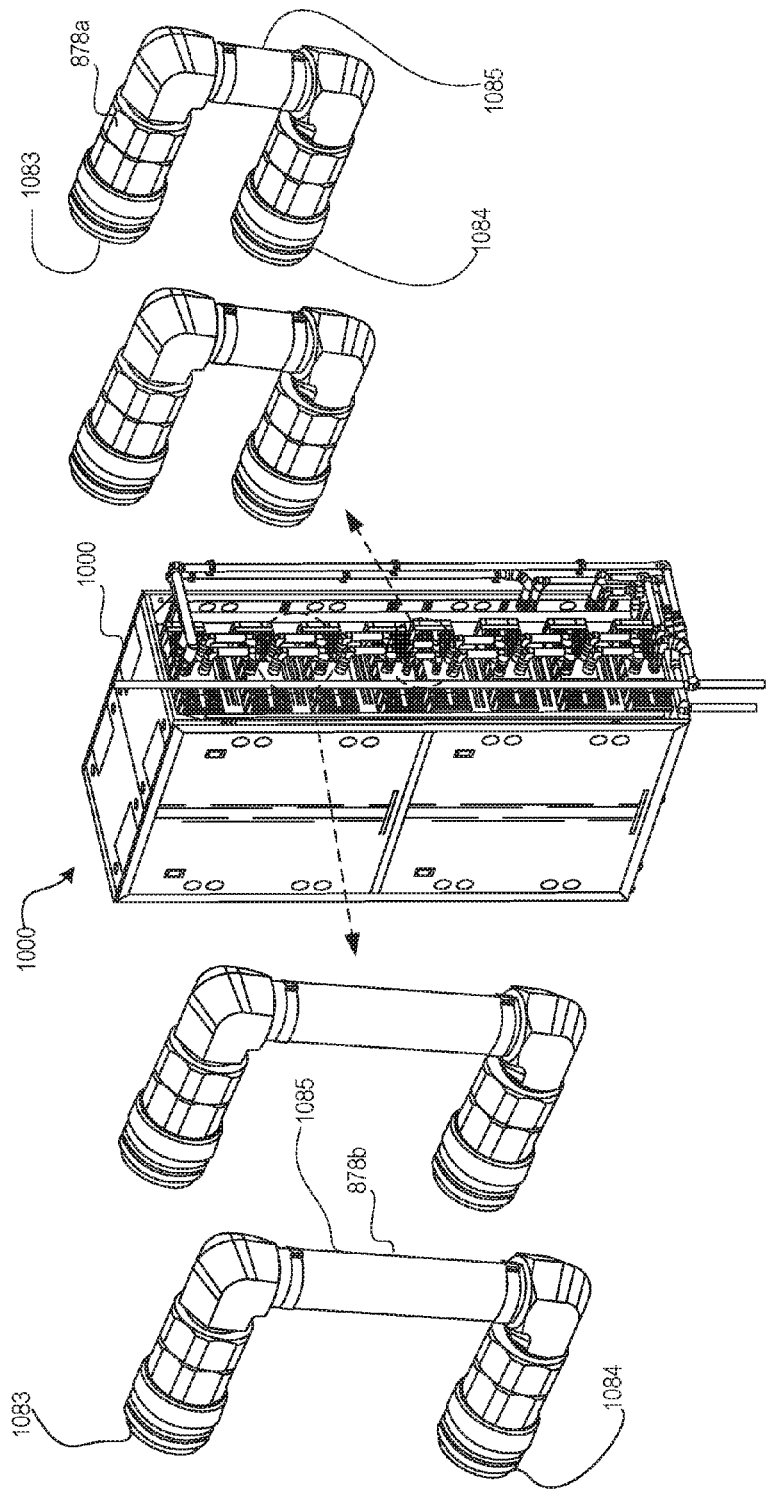
FIG. 10B illustrates a rear perspective view of the example RIHS of FIG. 5 with an exploded detail view of MLD conduits, according to one or more embodiments.
Figure 10C:
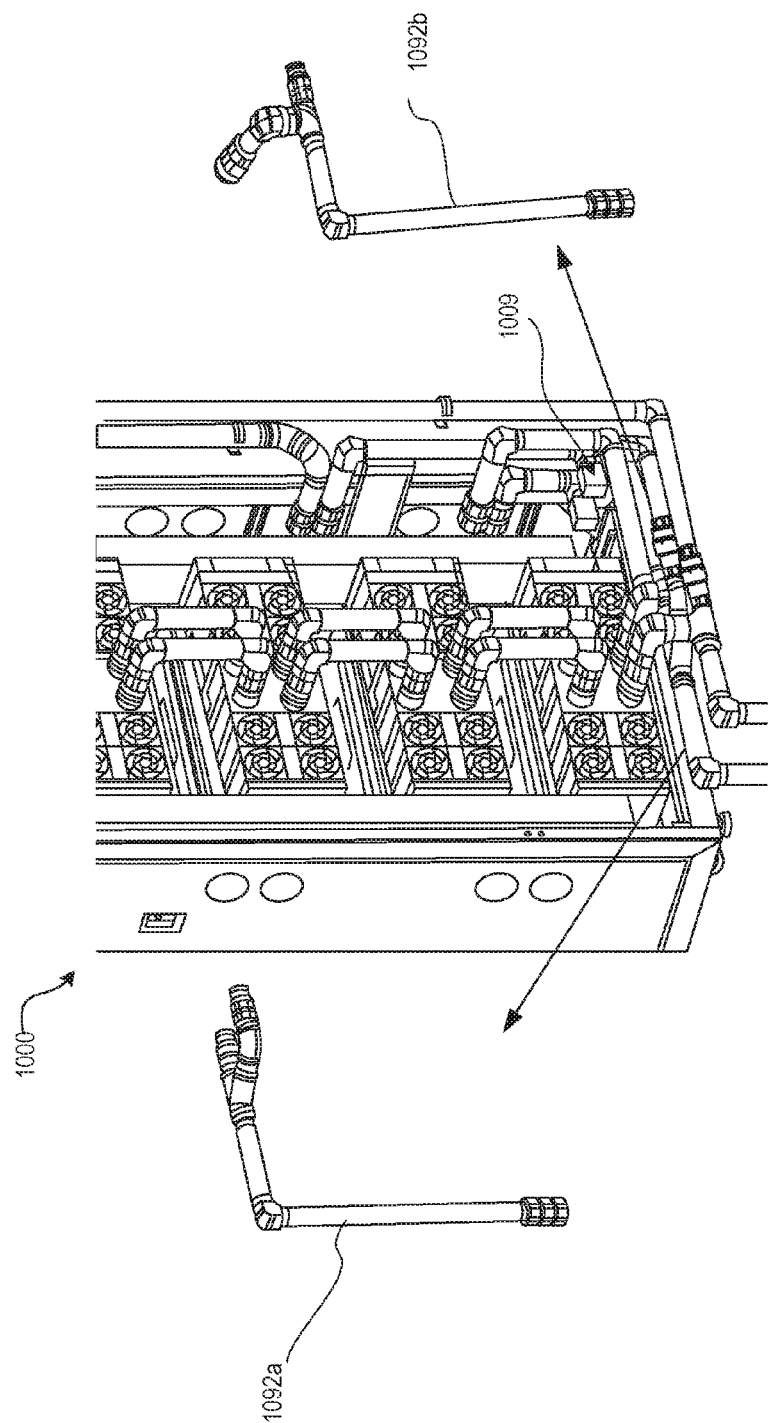
FIG. 10C illustrates a rear perspective view of the example RIHS of FIG. 5 with an exploded detail view of example bottom-feed facility supply conduits and return MLD conduits, according to one or more embodiments.

FIG. 10B illustrates example DL RIHS 1000 with MLD conduits 878a-878b (of FIG. 8) of two different multiples of rack units in dimension, according to one or more embodiments. Terminal connections 1083 and 1084 with connecting central conduit 1085 can be formed from hose materials with molded perpendicular bends. FIG. 10C illustrates the example DL RIHS 1000 including bottom-feed facility supply and return MLD conduits 1092a and 1092b, according to one or more embodiments. FIG. 10C also illustrates two service buttons 1009 located at the back-lower portion of the rack. Service buttons 1009 are located on and/or in communication with RFU 145 (FIG. 1), features of which are presented in greater detail in FIGS. 13A-13B. Service buttons 1009 enable manual triggering of a service mode of DL RIHS, that allows for removal and re-insertion of one or more nodes and/or other components plugged into the fluid rail without experiencing a significant amount of hydraulic force and without having to shut down the entire DL RIHS to implement the service of one component.

Water quality is a consideration when deploying liquid cooling subsystems for servers in a datacenter. Management of uncertain water quality conditions can be necessary to prevent performance degradation and equipment damage. Traditional microchannel cold plates used as a liquid 'heat sink' have fin spacing that are often only a few tenths of a millimeter. The close proximity provides for a large surface area per volume for efficiently absorbing and transferring heat. However, the tight tolerances also create a large dependency on filtered, clean water to prevent particulate build-up or corrosion across the channels. Because of this extremely high risk to performance decay, all cold plate liquid cooling systems deployed today use a secondary 'closed liquid loop' to ensure that their water quality is maintained at nominal levels. This secondary 'closed liquid loop' uses a secondary pump system (either in the server itself or a central distribution unit) to circulate water through the cold plates and back to a liquid to liquid heat exchanger where heat is transferred to the primary facility liquid cooling loop. This method of protecting the cold plates that utilizes a secondary pump and liquid to liquid heat exchanger is quite expensive in nature due to the cost of the heat exchanger, pumps, and the required power consumption of the secondary pumps.

Another way to protect the cold plates from water-borne contamination is the use of a filtration system attached locally at the rack. This is not a common practice today because there is not a consistent means of placing or fabricating a filtration system that can be agnostically deployed in a plurality of data centers. In data centers, the server dimension (commonly referred to as RU or Rack Unit) is always consistent, but the rack itself can be an infinite combination of shapes, sizes, and constituent components. Piping and bracketry will always be unique to the rack topology and presence of space availability. Deploying this type of system is not scalable in volume because the cost of re-engineering a piping system for mounting a unique filtration system in different racks is prohibitive.

Another key issue is capturing extraneous rack-level liquid telemetry, making decisions upon that data, and passing those decisions down to the servers within the rack. Servers are able to closely monitor liquid events that are local to their control plane, but do not have visibility to rack liquid events (water shortage, leaks, etc.) that may impact an individual server's ability to operate in a nominal state. Thus, the various aspects of the disclosure provides filtration, flow rate, and leak control device that can be used agnostically amongst rack configurations, be flexibly located in all server racks for preserving water quality to liquid cooled IT devices within the rack, and pass down rack-level liquid control plane telemetry to connected servers.

Figure 11:
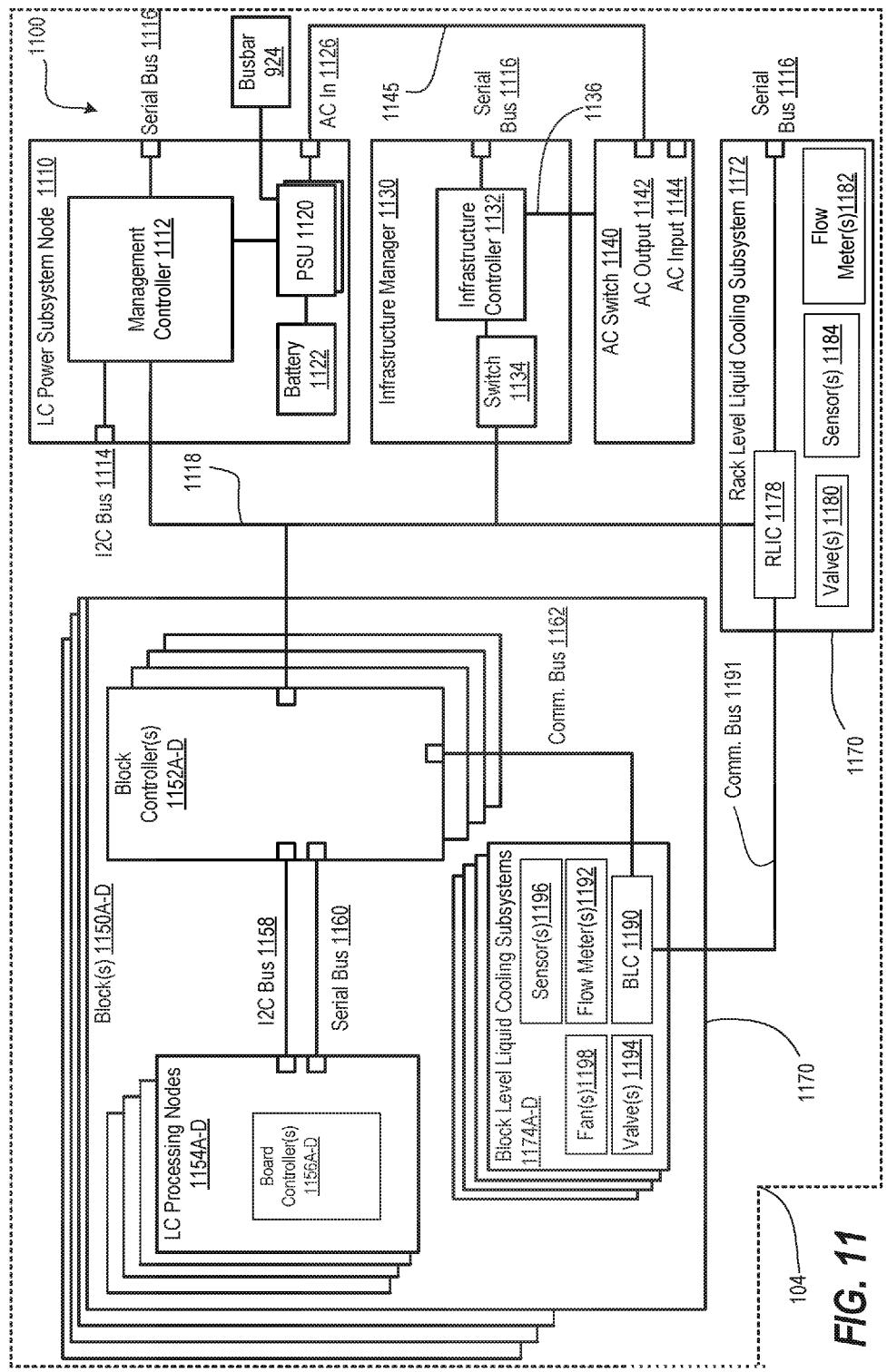
FIG. 11 is a block diagram illustration of an example DL RIHS, according to one or more embodiments.

FIG. 11 illustrates a block diagram representation of an example DL RIHS 1100, within which one or more of the described features of the various embodiments of the disclosure can be implemented. Referring specifically to FIG. 11, there is illustrated a two-dimensional block diagram of an example DL RIHS 1100 configured within a liquid-cooled, modular, expandable rack with modular configuration of various functional components inserted therein. DL RIHS 1100 includes rack 104, which can comprise one or more panels of sheet metal or other material interconnected to form a three dimensional volume (as illustrated in FIGS. 3-7), which is generally referred to in the industry as a rack. The various components are communicatively connected to one or more other components via power and communication cables (or buses), which are generally represented by the connecting lines of FIG. 11 (e.g. communication bus 1191, communication bus 1162, serial bus 1160). DL RIHS 1100 comprises a hierarchical arrangement of liquid-cooled processing nodes, liquid-cooled power subsystem nodes and other functional processing components or IT gear located within end nodes or servers.

In the illustrated embodiment, in addition to the previously introduced LC server nodes, DL RIHS 1100 comprises an LC power subsystem node 1110, which includes a management controller (MC) 1112 communicatively connected to one or more power supply units (PSUs) 1120. In one embodiment, PSUs 1120 are liquid cooled. MC 1112 can receive power supply data and settings from PSUs 1120. PSUs 1120 are connected to alternating current (AC) input power terminal 1126 that provides a source of AC power to PSUs 1120. Backup battery 1122 is connected to PSUs 1120 to supply backup system power in case of a loss of primary power (e.g., AC power) to DL RIHS 1100. AC switch 1140 controls the connection of AC power to DL RIHS 1100. AC switch 1140 has an AC input terminal 1144 and an AC output terminal 1142. An AC power cable 1145 is connected between, and supplies AC power from, AC switch 1140 to PSUs 1120.

MC 1112 is communicatively connected to communication bus 1118 and an I2C bus 1114. In one embodiment, communication bus 1118 can be an Ethernet cable providing connection via an Ethernet network. Communication bus 1118 is communicatively connected between MC 1112 and switch 1134 of infrastructure manager (IM) 1130. Switch 1134 of Infrastructure manager (IM) 1130 is communicatively connected to IM controller 1132. Switch 1134 enables IM controller 1132 to communicate with block controllers 1152*a-d* via communication bus 1118. According to at least one embodiment, MC 1112 and IM 1130 provide certain control and/or management signals to block controllers 1152*a-d* via communication bus 1118. IM controller 1132 is communicatively connected to AC switch 1140 and to serial bus 1116.

DL RIHS 1100 further comprises a plurality of processing blocks 1150*a-d*. Within the description, the term processing block or block are synonymous, and can be utilized interchangeably, with a "chassis" or "block chassis" that can hold multiple servers/nodes/sleds, etc. Processing blocks 1150*a-d* comprise block controllers 1152*a-d*, LC processing nodes 1154*a-d* and block-level liquid cooling subsystems 1174*a-d*. Each of block controllers 1152*a-d* are communicatively connected to communication bus 1118. Within each block 1150 is at least one, and likely a plurality of LC processing nodes 1154*a-d*, generally referred to as LC nodes 1154*a-d*, and synonymous with the previously-introduced LC nodes 102, 802 (FIGS. 1, 8, respectively). As one aspect of the disclosure, the number of nodes that can be placed within each block and/or can be supported by a single block controller, and can vary based on the block dimension and relative to the size and configuration of each processing node. Additionally, one or more of the blocks can be utilized to provide rack-storage of storage devices. Each LC node 1154 that is controlled by a respective block controller 1152 is communicatively coupled to block controller 1152 via an I2C bus 1158 and a serial bus 1160. Each LC node 1154*a-d* includes board controller 1156*a-d* (synonymous with NC 118, FIG. 1) that can control one or more aspects of the operation of that LC node 1154*a-d*.

DL RIHS 1100 further comprises a liquid cooling control subsystem 1170 that includes a rack-level liquid cooling subsystem 1172 and block-level liquid cooling subsystems 1174*a-d*. In one embodiment, control components of rack-level liquid cooling subsystem 1172 are physically located on a liquid instrumentation management circuit board and control components of block-level liquid cooling subsystems 1174*a-d* are physically located on a block liquid control circuit board. Rack-level liquid cooling subsystem 1172 controls the overall liquid cooling of DL RIHS 1100, while block-level liquid cooling subsystems 1174*a-d* control the liquid cooling of individual blocks 1150*a-d* and the LC nodes within the particular block.

Rack-level liquid cooling subsystem 1172 includes a rack-level liquid infrastructure controller (RLIC) 1178 that is communicatively coupled to each of block controllers 1152 via communication bus 1118 and to each of the block-level liquid cooling subsystems 1174*a-d* via communication bus 1191. RLIC 1178 is synonymous with and provides the same functionality as rack liquid infrastructure controller (RLIC) 942 (FIG. 9). Similarly, block controller 1152 can be synonymous with and provide the same or overlapping functionality as block liquid controllers (BLCs) 887 (FIG. 8). RLIC 1178 is also communicatively coupled to serial bus 1116 for communication with MC 1112.

Rack-level liquid cooling subsystem 1172 further includes one or more proportional supply valves 1180, one or more sensors 1184, and one or more flow meters 1182. RLIC 1178 is communicatively coupled to supply valve 1180, sensors 1184 and flow meters 1182. In one embodiment, supply valve 1180 controls an incoming cooling liquid supply flow rate to DL RIHS 1100. In another embodiment, supply valves controls an incoming or an outgoing (return) cooling liquid supply rate of DL RIHS 1100. Sensors 1184 can be temperature sensors that record temperature within DL RIHS 1100. Flow meters 1182 can measure flow rates of cooling liquid within DL RIHS 1100. RLIC 1178 can receive electrical signals containing data and measurements from supply valve 1180, sensors 1184, and flow meters 1182. Also, RLIC 1178 can transmit electrical signals and/or communicate data, instructions and settings to supply valve 1180, sensors 1184, and flow meters 1182.

Each of the block-level liquid cooling subsystems 1174*a-d* includes block liquid controller (BLC) 1190 (implemented as a block liquid control board (BLCB)) that is communicatively coupled to a respective block controller 1152 via communication bus 1162 and to RLIC 1178 via communication bus 1191. Within the description herein, the BLCB is also referred to generally as a block liquid controller 1190. Block-level liquid cooling subsystems 1174*a-d* further include one or more proportional liquid control valves 1194, one or more sensors 1196, one or more flow meters 1192, and one or more fan modules 1198.

BLC 1190 is communicatively coupled to proportional liquid control valves 1194, sensors 1196, flow meters 1192, and fan modules 1198. In one embodiment, proportional liquid control valves 1194 can regulate, adjust and control an incoming cooling liquid supply flow rate to blocks 1150, and by extension to the nodes within the particular block. Alternatively and/or in addition, proportional liquid control valves 1194 can control an outgoing (return) cooling liquid supply rate. In an embodiment, sensors 1196 can be temperature sensors that sense temperatures within LC processing nodes 1154 and flow meters 1192 can measure flow rates of cooling liquid within blocks 1150. BLC 1190 can receive electrical signals containing data and measurements from proportional liquid control valves 1194, sensors 1196, flow meters 1192, and fan modules 1198. BLC 1190 can also transmit electrical signals containing data, instructions and settings to proportional liquid control valves 1194, sensors 1196, flow meters 1192, and fan modules 1198.

According to one aspect of the disclosure, block controller 1152 performs the majority of the operations at the block level, including the calculations described herein and presented in the flow charts. The BLC 1190 operates more as a pass-through device for implementing flow control aspects based on input received from block controller 1152. During flow control operations, BC 1152 provides signals to BLC 1190 informing BLC 1190 of what values to set the block valves to. BC 1152 calculates and triggers BLC to issue PWM values that are forwarded and/or transmitted to the corresponding block valve(s). BC also provides control signals for other PWM modules that control the one or more air movers (e.g., fans). It is appreciated that in some embodiments, the functionality of a block controller 1152 and a block liquid controller 1190 can be provided by a single controller module, rather than separate modules. Additionally, in alternate embodiments, some of the functions described as being performed by the block controller 1152 can in fact be performed by the block liquid controller 1190.

Thus, the description herein of specific functions being performed by specific controllers is not intended to imply any limitations on these two controllers and/or the overall disclosure.

According to one aspect of the disclosure, liquid cooling control subsystem 1170 and specifically RLIC 1178 can receive an incoming cooling liquid supply flow rate corresponding to an amount and rate of incoming cooling liquid supply being supplied to DL RIHS 1100. The flow rate can be measured by flow rate meter 1192. RLIC 1178 calculates a maximum flow rate cap for each of block of LC nodes 1154*a-d* and transmits the maximum flow rate cap to each block controller of a respective block the LC nodes. RLIC 1178 triggers each block controller to adjust the block controller's respective flow rates to correspond to the received maximum flow rate cap for that block.

One aspect of the disclosure is an appreciation that to ensure effective cooling of the DL RIHS 1100, it may be necessary to adjust the cooling liquid flow rates to the overall DL RIHS 1100 and to also adjust the cooling liquid flow rates to individual blocks, processing nodes and components of DL RIHS 1100. In particular, it may be necessary to provide real-time increases of cooling liquid flow rates to LC nodes 1154*a-d* and/or blocks containing LC nodes 1152*a-d* that are consuming high levels of power and thus generating higher than normal/average levels of heat.

Figure 12A:
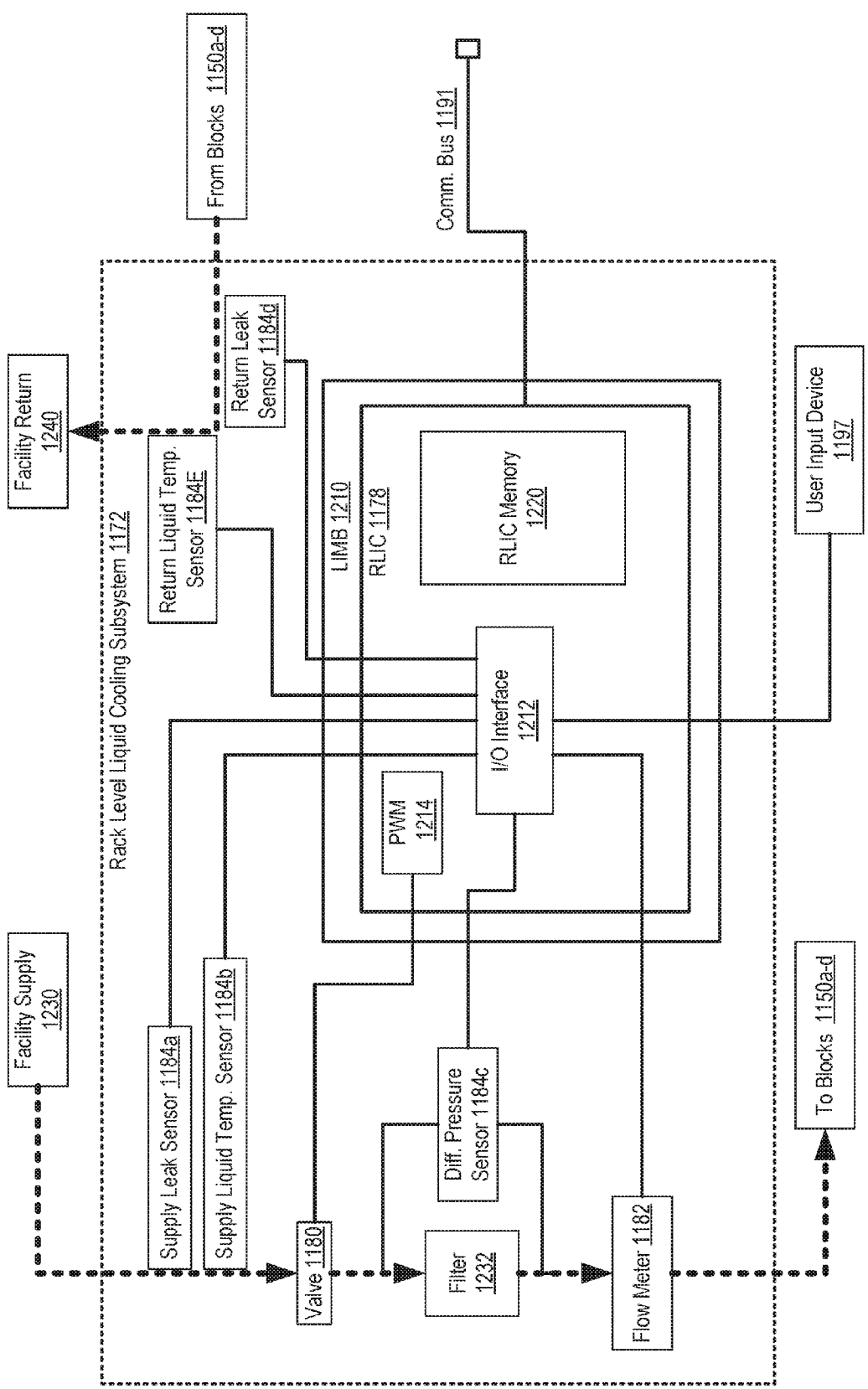
FIG. 12A is a block diagram illustrating the connectivity of components within a rack-level cooling subsystem for controlling liquid cooling of LC nodes in a DL RIHS via a rack-level liquid cooling infrastructure controller, in accordance with one embodiment.

FIG. 12A illustrates further details of the connectivity of functional components within a rack level liquid cooling subsystem 1172 for controlling liquid cooling of LC nodes 1154*a-d* within DL RIHS 1100 (of FIG. 11). Within the figure, signal and/or data communication buses are shown connecting the various sensors and valves to RLIC 1178 and/or components within RLIC 1178, while liquid conduits are presented as dotted lines with directional arrows indicate a direction in which cooling liquid flows. Rack level liquid cooling subsystem 1172 includes RLIC 1178 that is physically located on liquid instrumentation management circuit board (LIMB) 1210. RLIC 1178 includes I/O interface 1212, pulse width modulation (PWM) circuit 1214, and RLIC memory 1220. In one embodiment, RLIC memory 1220 can be a non-volatile memory device such as flash memory. RLIC memory 1220 can store algorithms and firmware that, when executed by RLIC 1178, perform one or more of the processes and methods described herein. PWM circuit 1214 generates PWM signals that can control the operation of connected devices such as the position of proportional supply valve 1180. I/O interface 1212 enables communication between RLIC 1178 and other connected devices such as valves, sensors, and flow meters.

Facility supply 1230 is a source of cooling liquid for DL RIHS 1100. In one embodiment, cooling liquid provided by facility supply 1230 can be water. Facility supply 1230 is in fluid communication with supply valve 1180. Supply valve 1180 is in fluid communication with filter 1232, via input flow rate control valve 1180. In one embodiment, filter 1232 is synonymous with hot-pluggable filtration subunit (FRU) 937 (FIG. 9). Filter 1232 can remove contaminants or particulates from the cooling liquid. Filter 1232 is in fluid communication with flow meter 1182, which is in fluid communication with liquid cooling components of blocks 1150A-D via the liquid rail (not shown). Flow meter 1182 measures the flow rate of cooling fluid into RIHS.

From a block-level perspective, cooling liquid flows from incoming facility supply 1230, through supply valve 1180, filter 1232, and then on to liquid cooling components of blocks 1150A-D. After the cooling liquid has removed heat from blocks 1150A-D, the cooling liquid flows to facility return 1240. According to one or more embodiments, the cooling liquid received at facility return 1240 can be recirculated for use or discarded or otherwise used at the facility.

The incoming flow rate of cooling liquid to DL RIHS 1100 can be regulated by supply valve 1180. Supply valve 1180 is communicatively coupled to PWM circuit 1214. Supply valve 1180 can be placed in different states of openness, ranging from fully closed (with no liquid flow) to fully open (for full or maximum liquid flow). RLIC 1178 can control the open state/position of (and thus the liquid flow rate permitted through) supply valve 1180, thereby regulating the flow rate and amount of cooling liquid being supplied to DL RIHS 1100.

I/O interface 1212 is further communicatively coupled to supply leak sensor 1184*a*, supply liquid temperature sensor 1184*b*, and differential pressure sensor 1184*c*. Supply leak sensor 1184*a* can detect leaks in facility supply 1230. Liquid temperature sensor 1184*b* can measure the temperature of the incoming cooling liquid and provide an electrical signal proportional to the temperature of the incoming cooling liquid. Differential pressure sensor 1184*c* measures the pressure drop across filter 1232 and provides an electrical signal proportional to the differential pressure. According to one aspect, RLIC 1178 can determine that filter 1232 is clogged if the differential pressure received from differential pressure sensor 1184*c* falls below a pre-determined value.

I/O interface 1212 is further communicatively coupled to flow meter 1182. Flow meter 1182 can measure a flow rate of cooling liquid being supplied to DL RIHS 1100 and provide an electrical signal proportional to the flow rate to RLIC 1178 via I/O interface 1212. I/O interface 1212 is further communicatively coupled to return leak sensor 1184*d* and return liquid temperature sensor 1184*e*. Return leak sensor 1184*d* can detect leaks in facility return 1240. Return liquid temperature sensor 1184*e* can measure the temperature of the return (outgoing) cooling liquid exiting from RIHS and provide an electrical signal proportional to the temperature of the return cooling liquid. A user input device 1197 is communicatively coupled to I/O interface 1212. In one embodiment, user input device 1197 can include a keyboard, mouse and/or touch pad. User input device 1197 can allow an IT manager or system administrator to input a desired exterior ambient temperature for a rack or block and to modify that value as needed.

Figure 12B:
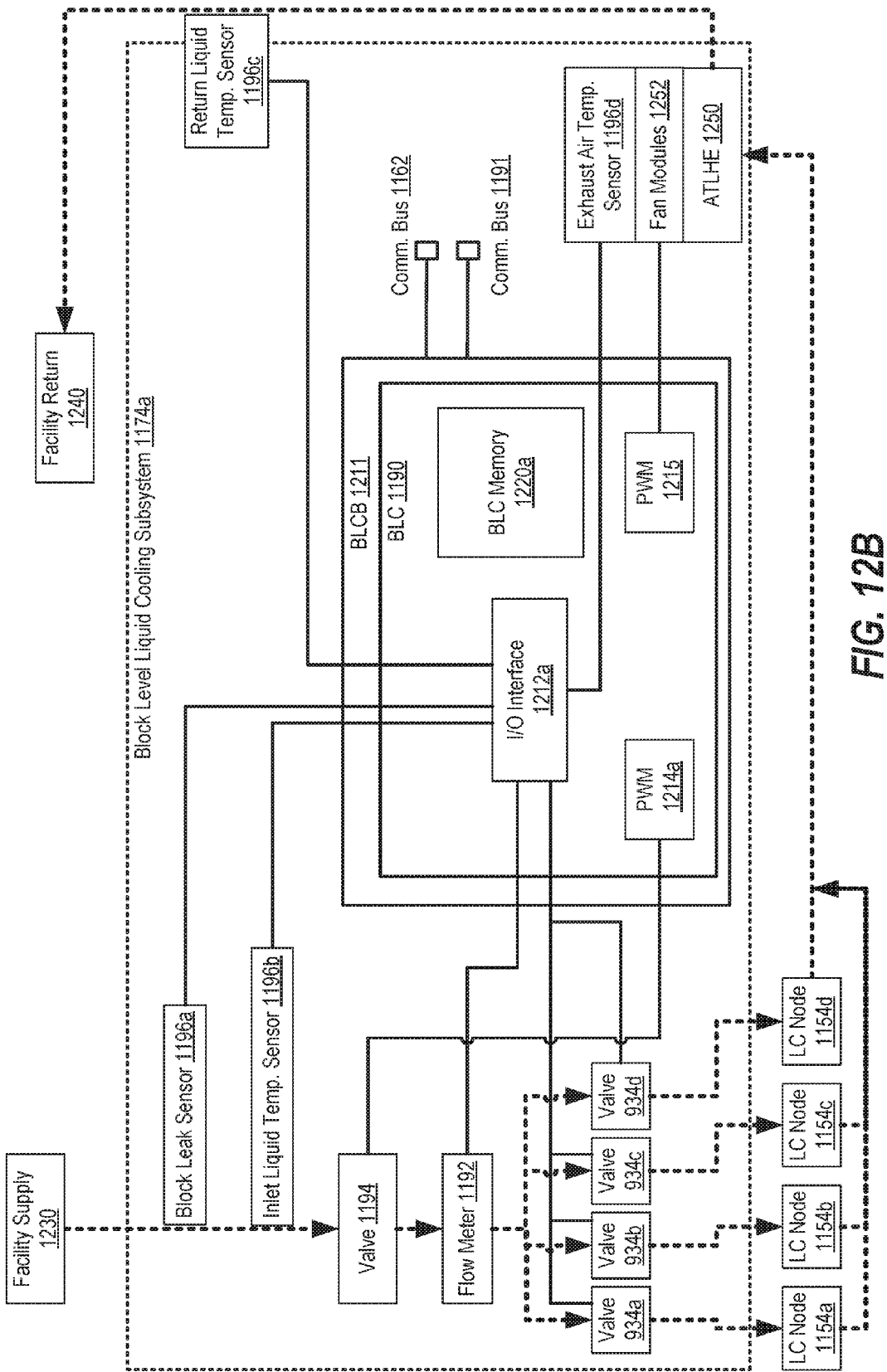
FIG. 12B is a block diagram illustrating the connectivity of components within a block level cooling subsystem for controlling liquid cooling of LC nodes in a DL RIHS via a block liquid controller, in accordance with one or more embodiments.

FIG. 12B illustrates further details of the connectivity of functional components within block-level liquid cooling subsystem 1174 and specifically within block-level liquid cooling subsystem 1174*a* that controls liquid cooling of LC processing nodes within DL RIHS 1100 (of FIG. 11). Within the figure, signal and/or data communication buses are shown connecting the various sensors and valves to BLC 1190 and/or components within BLC 1190, while liquid conduits are presented as dotted lines with directional arrows indicate a direction in which cooling liquid flows. Block-level liquid cooling subsystem 1174*a* includes BLC 1190, which is physically located on block liquid circuit board (BLCB) 1211. BLC 1190 includes I/O interface 1212*a*, pulse width modulation (PWM) circuit 1214*a*, PWM circuit 1215, and BLC memory 1220*a*. In one embodiment, BLC memory 1220*a* can be a non-volatile memory device such as flash memory. BLC memory 1220*a* can store algorithms and firmware that, when executed by BLC 1190, enables BLC 1190 to perform one or more of the processes and methods described herein. PWM circuit 1214*a* generates PWM signals that can control the operation of connected devices, such as the open position of liquid control valve 1194. PWM circuit 1215 generates PWM signals that can control the operation of connected devices, such as the speed at which air movers, such as fan modules 1194, operate. I/O interface 1212a enables communication between BLC 1190 and other connected devices such as valves, sensors, and flow meters.

As described herein, facility supply 1230 provides cooling liquid for each of the blocks 1150a-d. Specifically, facility supply 1230 provides cooling liquid that is in fluid communication with block liquid control valve 1194. The block liquid control valve 1194 is in fluid communication with flow meter 1192, which is in fluid communication with the LC processing nodes 1154a-d.

At the block and node levels, the flow path of cooling liquid runs from facility supply 1230, through block liquid control valve 1194, through flow meter 1192, through node input valves 934a-d (synonymous with node valves 134, FIG. 1) and then on to liquid cooled components associated with and located within LC nodes 1154a-d. LC nodes 1154a-d respectively include node-level input valves 934a-d and check valves 936, and each LC node includes a system of conduits extending through the LC node, as provided above in the description of the preceding figures (e.g., FIGS. 2 and 9). The cooling liquid flows through the LC nodes' system of conduits and absorbs and removes heat from within LC nodes 1154a-d. In one embodiment, the cooling liquid also flows to the air-to-liquid heat exchanger (ATLHE) 1250. In a closed loop configuration, ATLHE 1250 is mounted to each of LC nodes 1154a-d. Each ATLHE 1250 receives cooling liquid returning from LC processing nodes 1154a-d and the cooling liquid is passed through a heat exchanger that is cooled by a variable air flow supplied by one or more fan modules 1252. After exiting ATLHE 1250, the cooling liquid returns to facility return 1240.

The flow rate of cooling liquid within block 1150a (of FIG. 12A) can be regulated by liquid control valve 1194, which is mounted in the proximity to block 1150a. Liquid control valve 1194 is communicatively coupled to PWM circuit 1214a. BLC 1190 can control the open position of (and flow rate supported by) liquid control valve 1194 by regulating a PWM signal to valve 1194. BLC 1190 is thus able to regulate the flow rate of cooling liquid being supplied to LC processing nodes 1154a-d.

I/O interface 1212a is communicatively coupled to block leak sensor 1196a, a block inlet liquid temperature sensor 1196b, and exhaust air temperature sensor 1196d. Block leak sensor 1196a can detect cooling liquid leaks within block 1150a (of FIG. 12A). Block inlet temperature sensor 1196b can measure the temperature of the cooling liquid entering block 1150a (of FIG. 12A) and provide an electrical signal proportional to the temperature of the incoming cooling liquid. Exhaust air temperature sensor 1196d can measure the temperature of the exhaust air leaving ATLHE 1250 and provide an electrical signal proportional to the temperature of the exhaust air.

Fan modules 1252 of ATLHE 1250 are communicatively coupled to PWM circuit 1214a. BLC 1190 can control the fan speed of fan modules 1252 by regulating a PWM signal to fan modules 1252. By regulating the PWM signal to fan modules 1252, BLC 1190 regulates the air flow rate of cooling air being supplied to ATLHE 1250.

I/O interface 1212a is further communicatively coupled to flow meter 1192. Flow meter 1192 can measure a flow rate of cooling liquid flowing through block 1150a and provide an electrical signal proportional to the flow rate to BLC 1190 via I/O interface 1212a. I/O interface 1212a is further communicatively coupled to return liquid temperature sensor 1196c. Return liquid temperature sensor 1196c can measure the temperature of the return (outgoing) cooling liquid from block 1150a and provide an electrical signal proportional to the temperature of the return cooling liquid.

In one embodiment, node input valves 934A-D can be open/close or on/off valves that can be set to only one of two positions. In this embodiment, node input valves 934a-d are configured to be fully open unless closed by block controller or node controller following detection of a leak within the specific node. The flow rate of cooling liquid through each node is then determined based on the maximum flow rate provided to the proportional valve serving the particular block of nodes. In an alternate embodiment that supports granular node-level flow control, the flow rate of cooling liquid within each of the LC processing nodes 1150a-d can be regulated by node input valves 934a-d. In this embodiment, node input valves 934a-d are proportional valves and are communicatively coupled to PWM circuit 1214a. Accordingly, BLC 1190 can control the open position of (and flow rate supported by) of each of the node input valves 934a-d by regulating a PWM signal to the valves. BLC 1190 is thus able to granularly regulate the flow rate of flow and/or amount of cooling liquid being supplied to each of LC processing nodes 1154a-d.

Figure 12C:
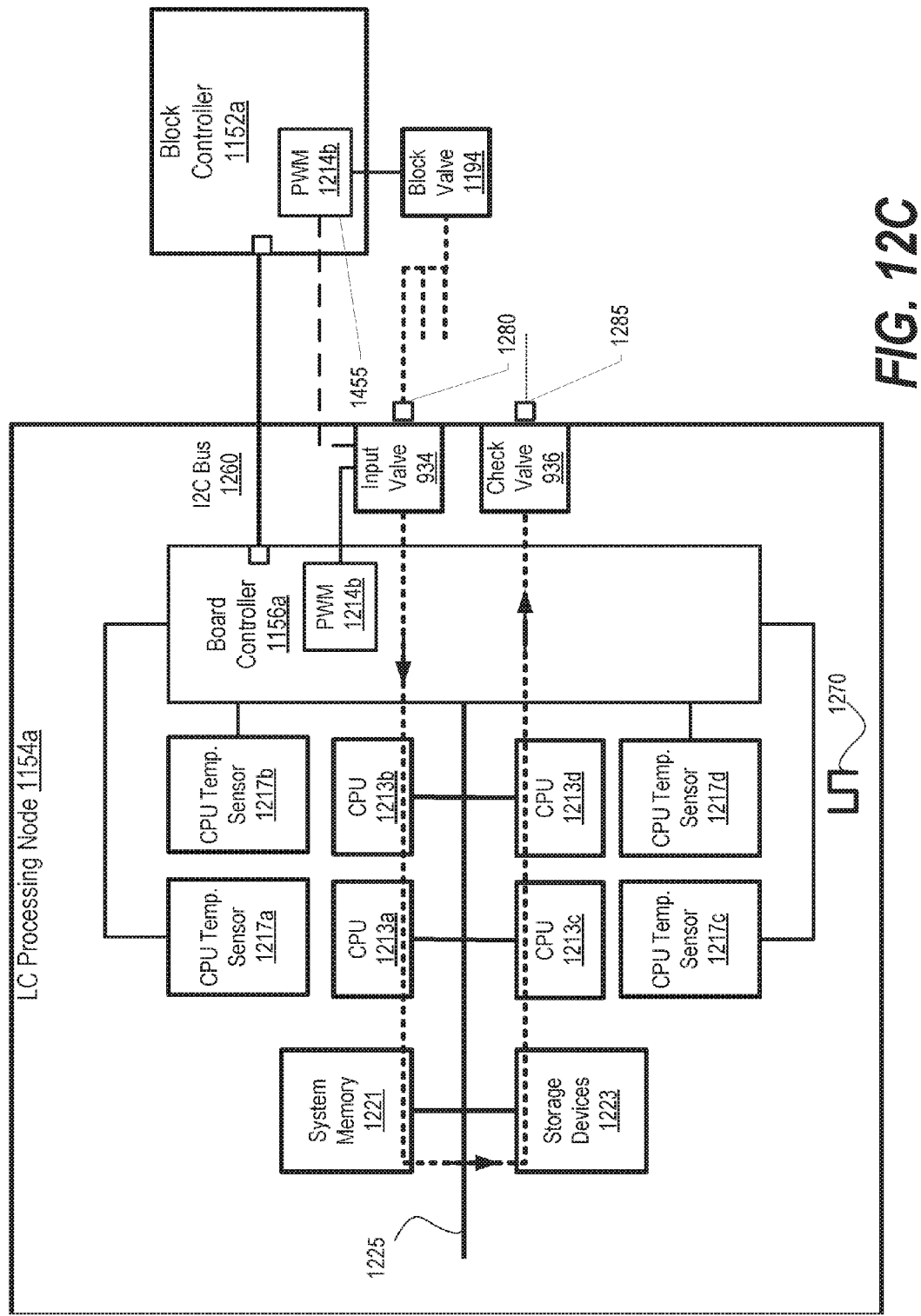
FIG. 12C is a block diagram further illustrating the connectivity of components within the DL RIHS and specifically further illustrates components of an LC processing node, in accordance with one embodiment.

With reference now to FIG. 12C, there is illustrated one embodiment of a single LC node 1154 and, in particular, LC node 1154a. In the illustrative embodiments, LC node 1154a includes a chassis on and/or within which the components of LC node are installed. The chassis, or sled, as it is also called, can be slid into and out of the chassis receiving front bay of the block chassis. LC processing node 1154a comprises one or more processors or central processing units (CPUs) 1213a, 1213b, 1213c and 1213d, (collectively CPUs 1213a-d) that are communicatively connected to a system memory 1221 and storage device(s) 1223 via a system bus 1225. Storage device(s) 1223 can be utilized to store one or more software and/or firmware modules and/or data (not specifically shown). In one embodiment, storage device(s) 1223 can be a hard drive or a solid-state drive. In some embodiments, LC node 1154a can actually be a storage node providing a sled in which a large number of storage devices are hosted, where the storage devices are specifically configured to store mass amounts of data.

CPUs 1213a-d are also communicatively connected to board controller 1156a via system bus 1225. In one embodiment, board controller 1156a can reside on a motherboard that also contains CPUs 1213a-d. Board controller 1156a is communicatively connected to block controller 1152a by I2C bus 1260. Board controller 1156a can facilitate communication between CPUs 1213a-d and block controller 1152a. Board controller 1156a can include PWM circuit 1214b that is communicatively coupled to node level input valve 934. In one embodiment PWM circuit 1214b can be located within block controller 1152a and can be communicatively coupled to node level input valve 934 via one or more cables or signal buses 1455. Block valve 1194 is in fluid communication with input valve 934 via node liquid supply port 1280. LC node 1154a includes a check valve 936 that has a node liquid return port 1285. LC node 1154a receives cooling liquid via node liquid supply port 1280 and input valve 934. The CPUs, system memory and storage devices are cooled by the circulating cooling liquid. The cooling liquid exits LC node 1154a via check valve 936 and node liquid return port 1285.

LC node 1154a further includes temperature sensors 1217a, 1217b, 1217c and 1217d, (collectively temperatures sensors 1217a-d) that are communicatively connected to board controller 1156a. In the illustrative embodiment, temperatures sensors 1217*a-d* are mounted in thermal contact with CPUs 1213*a-d* such that temperature sensors 1217*a-d* can accurately measure the operating temperatures of CPUs 1213*a-d*. Temperature sensors 1217*a-d* can measure the temperature of their respective CPU and provide an electrical signal (temperature sensor signal 1270) that is proportional to the measured temperature to board controller 1156*a*. Board controller 1156*a* can receive temperature sensor signal 1270 and transmit temperature sensor signal 1270 to block controller 1152*a*, which can transmit temperature sensor signal 1270 to BLC 1190 (of FIG. 12B).

Figure 13A:
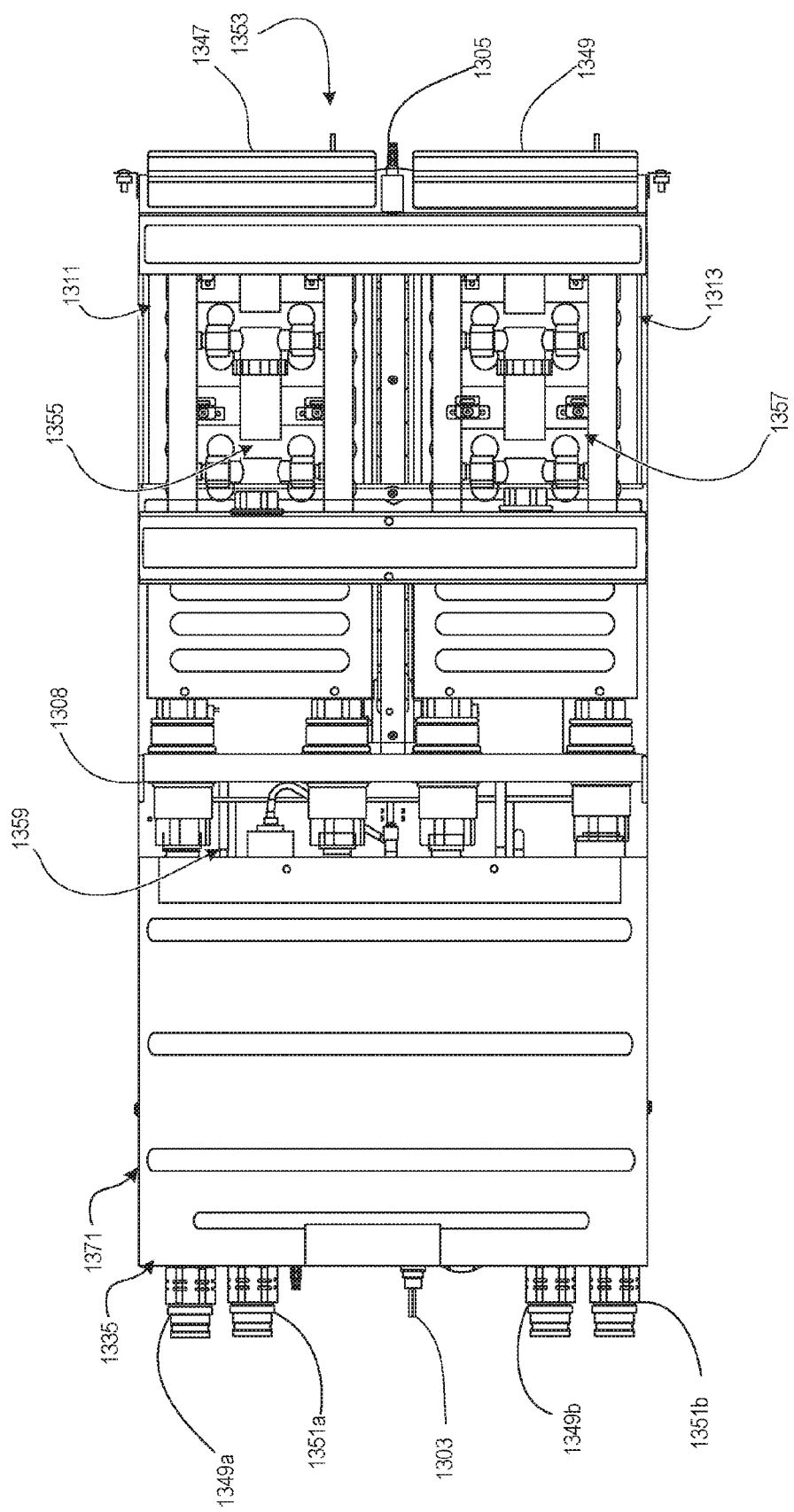
FIG. 13A illustrates a top view of a rack filtration unit (RFU) of the example cooling subsystem, according to one or more embodiments.
Figure 13B:
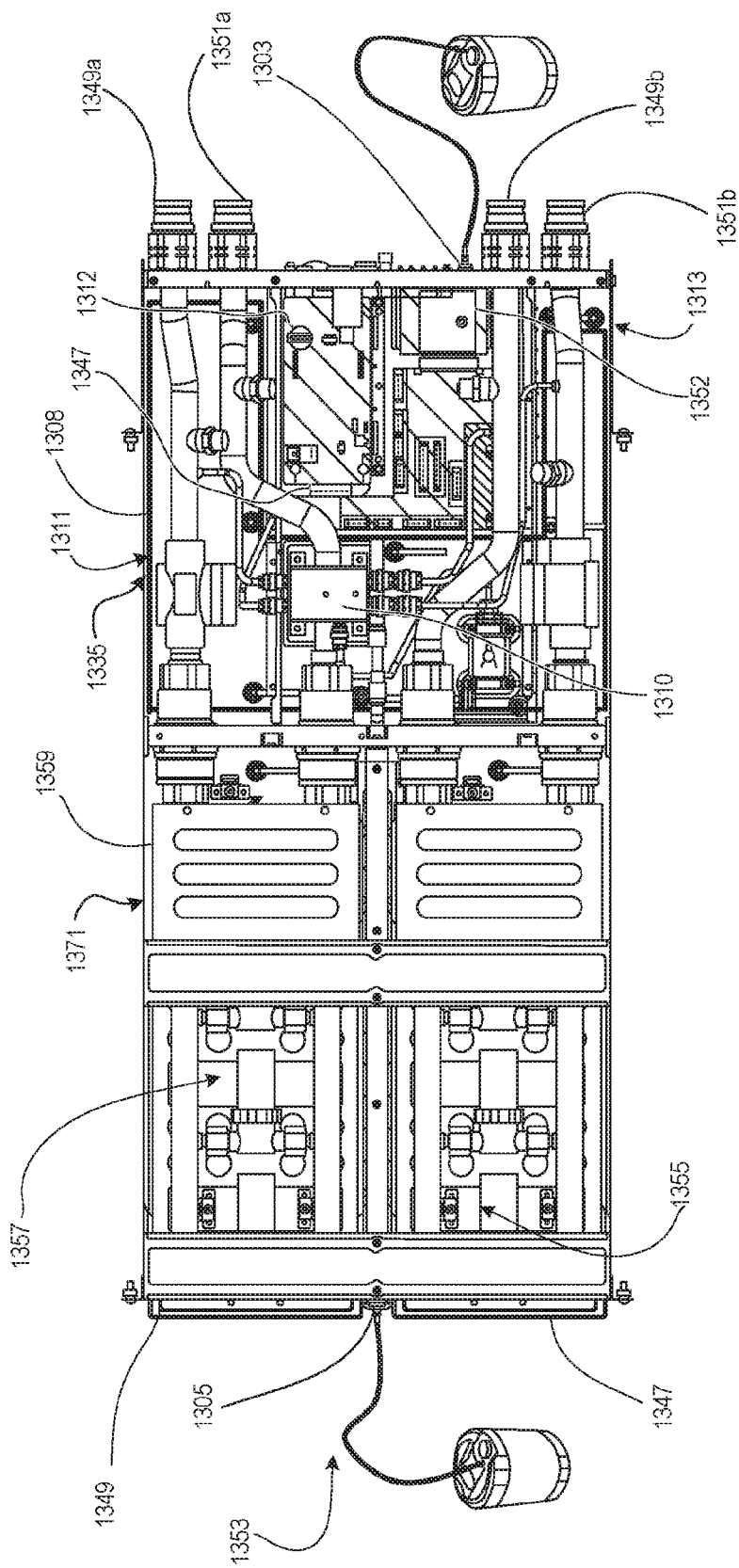
FIG. 13B illustrates a bottom view of the RFU of the example cooling subsystem, according to one or more embodiments.

In one embodiment, BLC 1190 can receive temperature sensor signal 1270 from each of CPUs 1213*a-d* associated with LC processing nodes 1154*a-d*, within a respective block 1150*a-d* of FIG. 11. BLC 1190 can identify a highest magnitude temperature from among the received temperature sensor signals 1270 for each of LC processing nodes 1154*a-d* within the respective block. BLC 1190 can retrieve, from BLC memory 1220*a*, a first operating temperature set point associated with the LC node having the highest magnitude temperature within that block. BLC 1190 then calculates a liquid flow rate for the block of LC processing nodes 1154*a-d* based on the highest magnitude temperature value and the first operating temperature set point. BLC 1190 then triggers PWM circuit 1114 to open block valve 1194 to allow sufficient liquid flow (within the maximum flow rate allowed for that block) to cool the particular CPU having the highest magnitude temperature. With this directed cooling, BLC 1190 is then able to maintain the set points for all CPUs within the block. In the node-level granular control embodiments, BLC 1190 can trigger each of the LC nodes to move their respective liquid control valves 934*a-d* (i.e. via individual PWM circuits providing signals to the respective valves 934*a-d*) to an open position FIGS. 13A-13B illustrate additional structural details of hot pluggable RFU 1371, which includes filters for filtering out contaminants in order to protect the liquid transfer conduits from clogging and/or chemical deterioration. FIG. 13B illustrates that the RFU 1371 includes Management Controller (MC) 1312, Block Controller(BC) 1352, and a Liquid Instrumentation Management Board (LIMB) 1347. RFU 1371 includes a front air purging connection 1303 for temporary bleeding of pressure for filter tray installation. RFU 1371 includes a rear air purging connection 1305 for temporary bleeding of pressure to enable low-resistance insertion/connection of LC nodes into the liquid cooling supply subsystem. With particular reference to FIG. 13A, RFU 1371 includes hot-pluggable filter drawer 1311 and drawer 1313 that are plumbed in parallel to allow for continued operation by an inserted filter during servicing of drawer 1311 or drawer 1313. RFU 1371 includes node chassis 1308 insertable into a rack of an RIHS. At least one node supply port 1349 and at least one node return port 1351 are positioned on an inserted side 1353 of the node chassis 1308 to seal for fluid transfer respectively to a facility liquid supply conduit and a rail supply conduit of the liquid rail of a liquid cooling system for the RIHS. First filtration subunit 1355 and second filtration subunit 1357 are housed in hot-pluggable filter drawer 1311 and drawer 1313. Each filtration subunit 1355 and filtration subunit 1357 is individually disengageable from node chassis 1308 for maintenance or replacement, while the other filtration subunit 1355 or filtration subunit 1357 remains engaged in the node chassis and continues liquid filtration. When one filtration subunit 1355 or filtration subunit 1357 is removed, a liquid coolant diversion network 1359 diverts liquid flow to the other filtration subunit 1355 or filtration subunit 1357 for continuous filtration of contaminants and/or particulates from the cooling liquid received from the supply side.

In one or more embodiments, RFU 1371 is a 2 RU (Rack Unit) enclosure that has two hot-swap filter drawers 1311, 1313 that can either be routed in parallel for redundant flow paths (enabling un-interrupted servicing) or, with a jumper hose installed, be configured for 2-stage filtration where the two filter drawers are connected in series enabling both particulate and chemical filtration. Each filtration subunits 1355 would be configured for one of these two functions. RFU 1371 can have onboard instrumentation for detecting filter integrity, such as via differential pressure and flow rate monitoring across each filter drawer. Onboard instrumentation can include, without limitation, LEDs for displaying filter status, control valves for enabling service modes, and general rack level leak control devices providing the ability to execute an Emergency Power OFF event to eliminate or substantially mitigate water damage to components in the rack in the event of a catastrophic leak. According to one embodiment, all rack-level liquid telemetry can be collected at the embedded RFU controller (LIMB 1347). The embedded RFU controller then generates and transmits, to each of the connected devices, decision logic that enables safe performance for all connected servers. Purge valve/s are utilized to reduce pressure during service events. RFU further includes redundant solenoid valves that can be triggered to automatically close off facility water during a leak event or scheduled service event. Embedded RFU controller can execute liquid management commands for connected liquid cooled devices within the rack (or series of racks). According to one aspect, the embedded RFU controller can initiate a rack flow balancing algorithm to all connected liquid devices. Liquid Instrumentation Management Board (LIMB) can provide integrated leak detection for monitoring leaks within the RFU 1371.

Figure 13C:
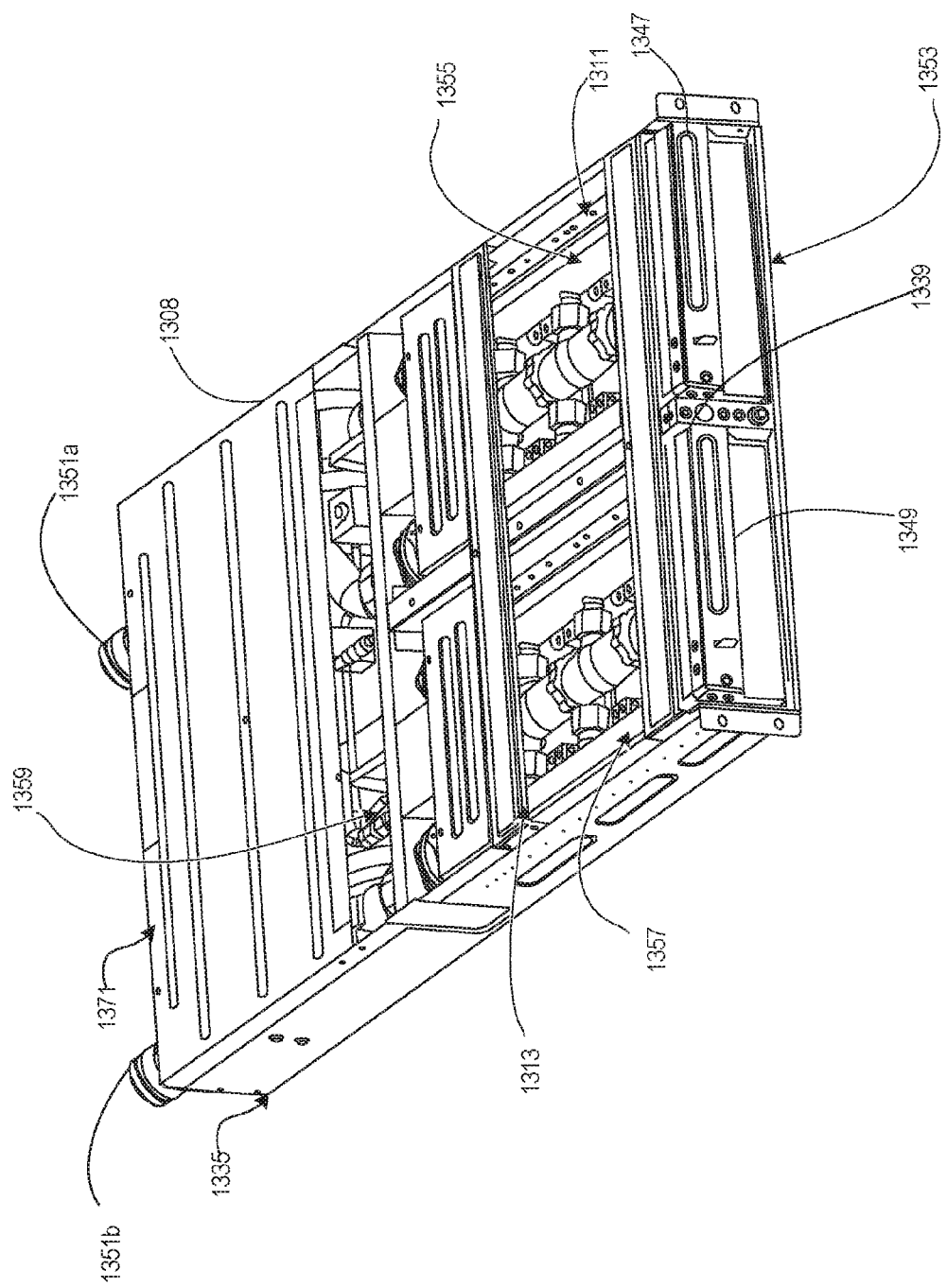
FIG. 13C illustrates a front perspective view of the RFU of FIGS. 13A-13B, according to one or more embodiments.

FIGS. 13B-13C illustrate purge check valves 1359 that prevent liquid short circuit through purge solenoid valve 1310 of RFU 1371. In an exemplary embodiment, dual node supply ports 1349*a*, 1349*b* and dual node return port 1351*a*, 1351*b* support two independent feeds with external solenoids that are powered and/or controlled from RFU 1371 for filter drawers 1311, 1313, respectively. According to one aspect, purge solenoid valve 1310 is triggered by a rack liquid infrastructure controller (RLIC) 1178 (FIG. 11) of LIMB 1347 or other service mode controller to open and dispense a specific amount of liquid from within the liquid cooling system of conduits to reduce the overall pressure of liquid within the system. In one embodiment, the amount of liquid released by purge solenoid valve 1310 can be variable based on the pressure within the system of conduits as measured by one or more liquid pressure sensors (not specifically shown). RFU 1371 includes a differential pressure sensor that measures a pressure drop across a filter and provides an electrical signal proportional to the differential pressure. According to one aspect, the RLIC can determine that the filter is clogged if the differential pressure received from differential pressure sensor 1184C (of FIG. 12A) falls below a pre-determined value.

In an exemplary service mode, a latching (non blind mate) small-diameter quick disconnect for "purge fitting" can be located at both a rear RFU face and a front RFU face. Purge fittings can be plumbed to a small-diameter purge solenoid valve connected to the RFU liquid system. Service mode push button is linked to LIMB at front RFU face near status LEDs and rear RFU face. Control logic can require button to be pushed for five (5) second to avoid accidental press. Control logic can also provide a protection scheme to prevent the button from being pressed too many times within a set time interval, the threshold being set to indicate an abnormal or failure condition. A CPU Subcool algorithm can delay service mode by thirty (30) seconds to increase coolant flow to CPUs and increase service window.

Figure 13D:
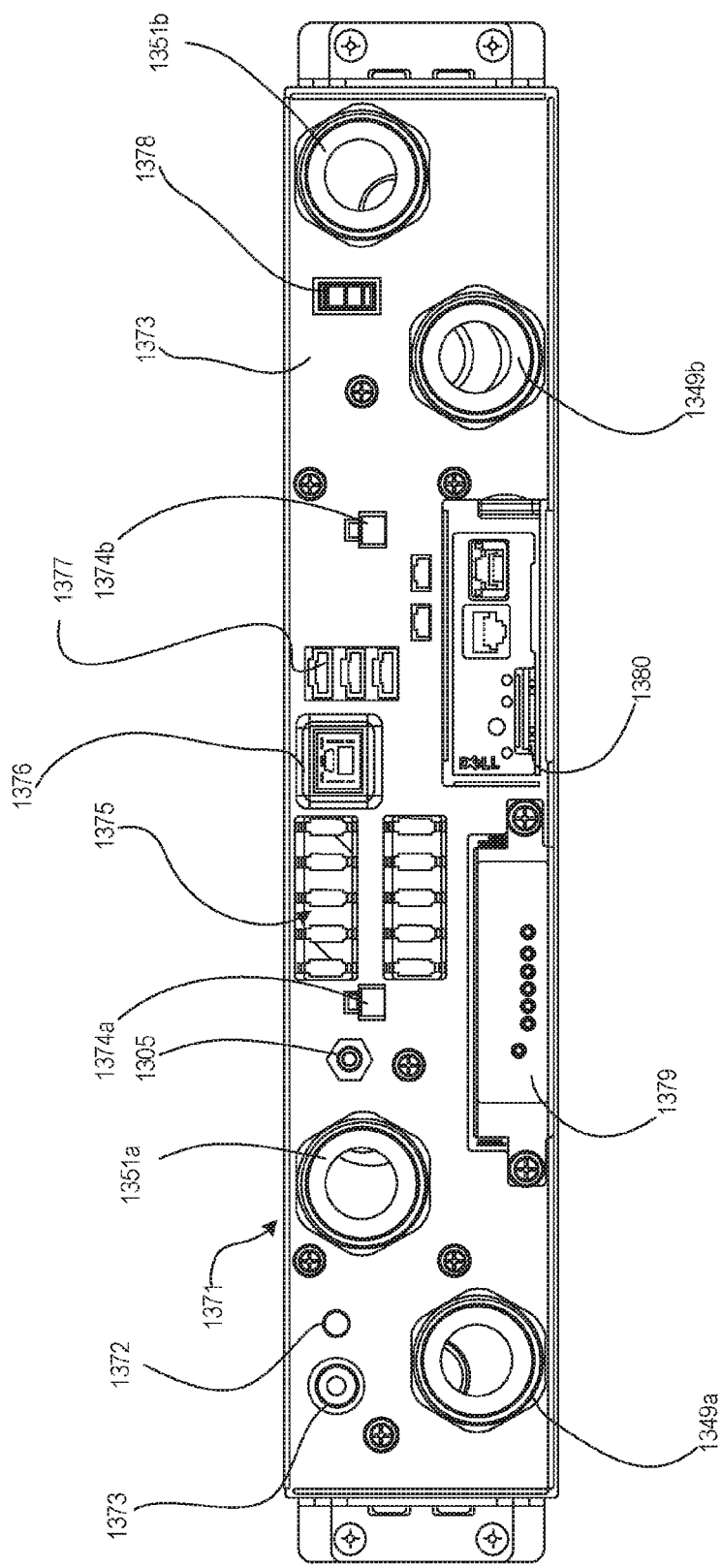
FIG. 13D illustrates a rear side view of the RFU of FIGS. 13A-13C.
Figure 13E:
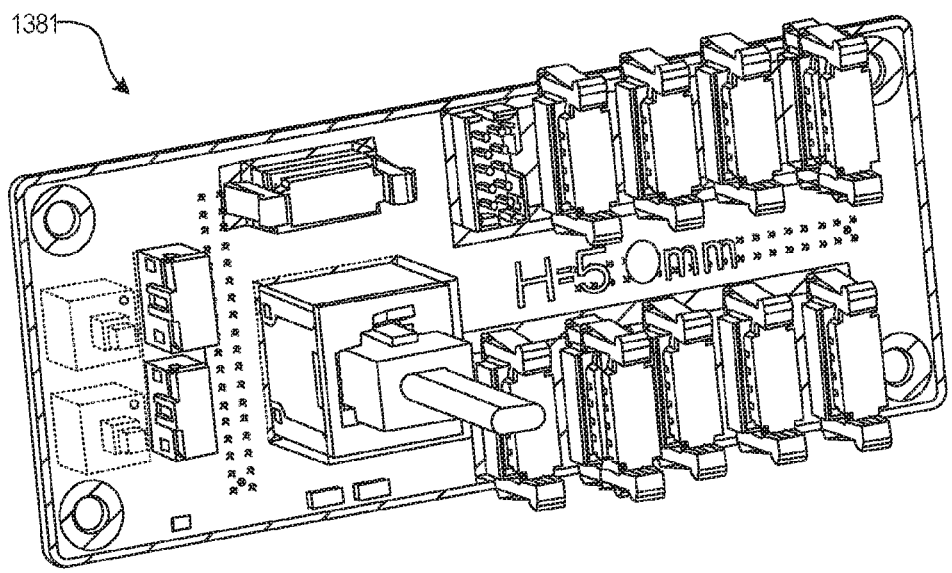
FIG. 13E illustrates a front isometric view of an RFU rear input/output (I/O) card, according to one or more embodiments.
Figure 13F:
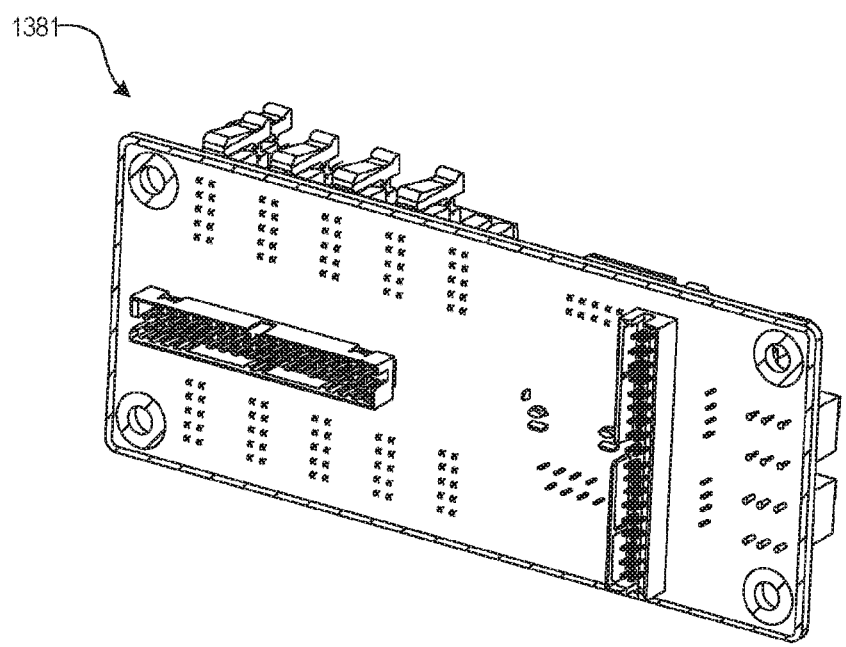
FIG. 13F illustrates a rear isometric view of the RFU rear I/O card of FIG. 13E, according to one or more embodiments.

FIG. 13D illustrates an RFU rear panel 1373 of the RFU 1371. As illustrated, service mode button 1372 and service mode LED 1373 are provided to support implementation of a service mode that allows for low-force insertion of liquid handling fittings. RFU rear panel 1373 includes air purging connection 1305 and dual node supply ports 1349a, 1349b and dual node return port 1351a, 1351b. Solenoid 1 and 2 power plugs 1374a, 1374b are provided for controlling emergency or maintenance shutoff of each filter drawer 1311, 1313. Block BLCB to LIMB connectors 1375 supports having each chassis in the rack having an independent data communication link or power connection to RFU 1371, which provides both communication and DC power to RFU 1371. Connection 1376 for RFU block controller (BC) link to Infrastructure Manager (IM) provides an uplink that allows the RFU 1371 to be registered as a rack device on any managed power bay when a discrete management controller (MC) is not used. Power bay auxiliary power input 1377 provides for up to three (3) power bays in an exemplary embodiment and can independently supply auxiliary power to the RFU 1371 for management functions. A test mode button 1378 allows rack management to perform self-assessment of liquid handling equipment before power-ON of the servers and/or LC nodes. RFU 1371 also includes RFU BC 1379 and RFU MC 1380. FIGS. 13E-13F illustrate an RFU rear input/output (I/O) card 1381 that supports each of the controls and interfaces described for FIG. 13D.

Figure 14:
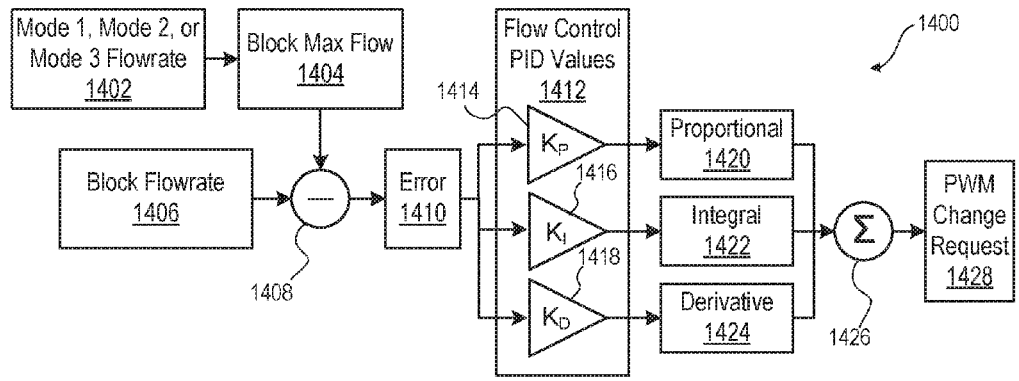
FIG. 14 illustrates a diagram of a procedure of controlling a liquid cooling subsystem to balance cooling within an RIHS, according to one or more embodiments.

FIG. 14 illustrates a rack flow balancing algorithm 1400 that is based on a proportional-integral-derivative (PID) controller. The PID controller is a control loop feedback mechanism that calculates an error value as the difference between a measured process variable and a desired setpoint. The controller attempts to minimize the error over time by adjustment of a control variable, such as the position of a control valve, to a new value determined by a weighted sum. A mode 1, mode 2 or mode 3 flow rate (block 1402) goes into setting a block maximum flow (BlockMaxFlow) (block 1404). A current block flow rate is sensed (block 1406) and a difference found with BlockMaxFlow (block 1404) in comparator 1408 to determine error (block 1410). Flow control PID values (block 1412) are used to individually amplify the error (block 1410), specifically a proportional constant $K_P$ (block 1414), integral constant $K_I$ (block 1416), and derivative constant $K_D$ (block 1418). The results are, respectively, a proportional value (block 1420), an integral value (block 1422), and a derivative value (block 1424) that are summed in summer 1426 to produce a Pulse Width Modulation (PWM) change request (block 1428).

In an exemplary embodiment, a variable BlockMaxFlow needs to exist within the RFU BC that is calculated upon rack power up (i.e., after power on self-test (POST) mode) and then, again, every ten (10) minutes on a recurring timer. In order to determine this value, all connected blocks must have their proportional valve set to 90% PWM and record the instantaneous block flow rate (BlockFlow) and then calculated as follows:

$$RackFlow1 = \sum_{i=1}^{n} BlockFlow(i) \qquad \text{Eqn. 1}$$

$$RackFlow2 = RFUFlowmeter1 + RFUFlowmeter2 \qquad \text{Eqn. 2}$$

$$BlockMaxFlow = \frac{RackFlow}{n} \qquad \text{Eqn. 3}$$

Rack Flow variable should be calculated after error checking RackFlow1 and RackFlow2. If both readings are acceptable, Rack Flow should be an average of the two readings. If both show error, BlockMaxFlow should be set to an error value and all blocks reset to default maximum flow rate stored in config file (Mode 1).

Figure 15:
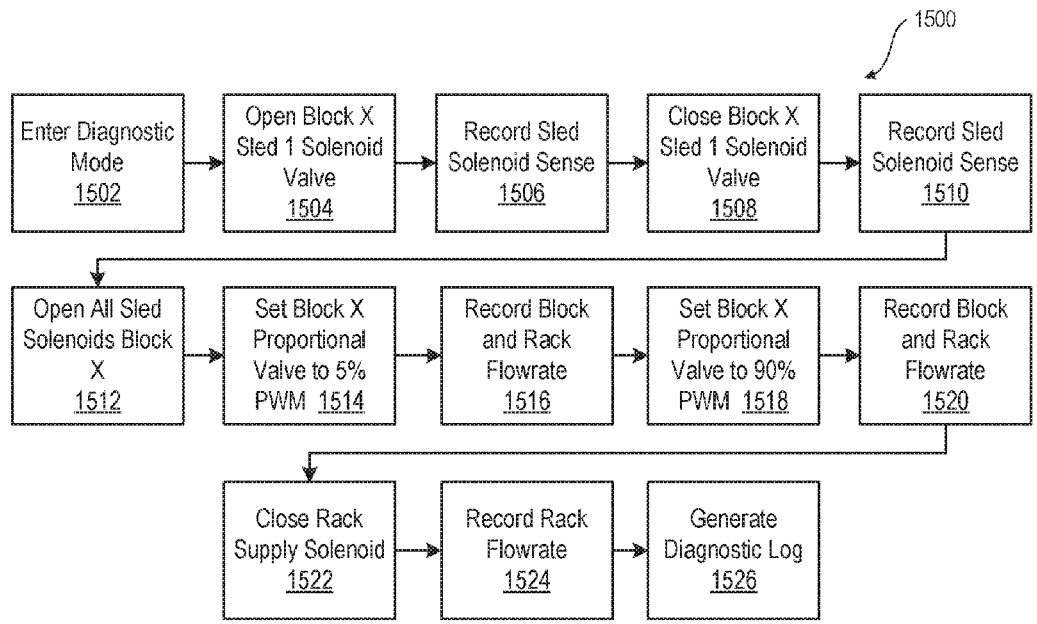
FIG. 15 illustrates a diagram of a procedure for performing a leak test of the liquid cooling subsystem, according to one or more embodiments.
Figure 16:
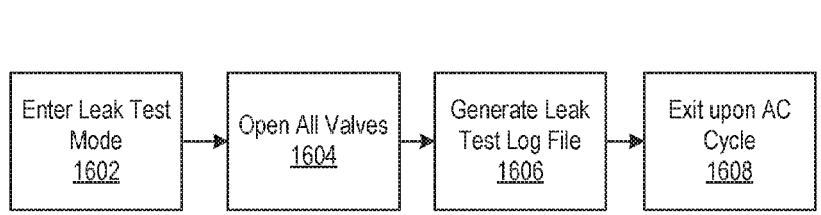
FIG. 16 illustrates a diagram of a procedure for testing seals of a liquid cooling subsystem, according to one or more embodiments.

FIG. 15 illustrates a procedure 1500 for a diagnostic mode of a liquid cooling subsystem that can include an RFU. The diagnostic mode procedure 1500 can for example accomplish one or more of the following goals: (a) open and close each valve within the rack; (b) verify instrumentation functionality; and (c) create a log file for pass/fail on each liquid handling device. The diagnostic mode can confirm pass/fail criteria for each device. According to one embodiment, one way of assessing whether the valves are functioning is to monitor a change in liquid flow rate through the valve. If water is not present, i.e., there is no flow rate detected, all valve tests will fail. If the flow meter reading on all connected devices is null, the diagnostic mode can exit. Once the diagnostic mode procedure is complete, the procedure can proceed to leak test mode procedure 1600 (FIG. 16). Leak test mode allows for a seal/functional integrity test of the liquid handling system within the rack. According to one embodiment, the leak test mode involves opening all of the flow valves and allow a gas-pressure and/or water flow leak test of the rack, while preventing the servers from powering on.

As a more detailed description, FIG. 15 illustrates the procedure 1500 for entering and performing a diagnostic mode. The procedure includes first entering the diagnostic mode (block 1502). Procedure 1500 includes opening block X sled 1 solenoid valve (block 1504). Procedure 1500 includes recording current sensed passing through the sled solenoid (block 1506). Procedure 1500 includes closing block X sled 1 solenoid valve (block 1508). Procedure 1500 includes recording current sensed passing through the sled solenoid (block 1510). Procedure 1500 includes opening all sled solenoids in block X (block 1512). Procedure 1500 includes setting block X proportional valve to 90% PWM (block 1514). Procedure 1500 includes recording block and rack flow rates (block 1516). Procedure 1500 includes setting block X proportional valve to 90% PWM (block 1518). Procedure 1500 includes recording block and rack flow rates (block 1520). Procedure 1500 includes closing rack supply solenoid (block 1522). Procedure 1500 includes recording rack flow rate (block 1524). Procedure 1500 includes generating diagnostic log (block 1526).

FIG. 16 illustrates the leak test mode procedure 1600, according to one embodiment. Procedure 1600 includes entering the leak test mode (block 1602). The procedure 1600 includes opening all valves (block 1604). The procedure 1600 includes generating a leak test log file (block 1606). The procedure 1600 includes exiting upon AC power cycle of the LC rack with a test mode button unlatched (block 1608). In an exemplary embodiment, the leak test mode procedure 1600 allows for a seal/functional integrity test of the liquid handling system of a LC rack. It will be used to open all of the flow valves and allow a gas-pressure and/or water flow leak test of the LC rack while preventing servers from powering on. The test mode button on the rear face of the rear I/O board of the RFU is manually latched. When latched, LC rack will prevent server power-on during rack AC power ON startup. AC power cycle with test mode button unlatched to exit "Test Mode" and initiate normal mode of leak detection. Leak detection features will be active during this time and any leaks detected are reported via the normal LED corresponding to the leak domain. All water flow control devices (RFU, block, and sled) open to allow for water or air to be pushed into the liquid handling components without server power-on. The procedure 1600 can support validation of the RC rack and customer datacenter installation.

Figure 17:
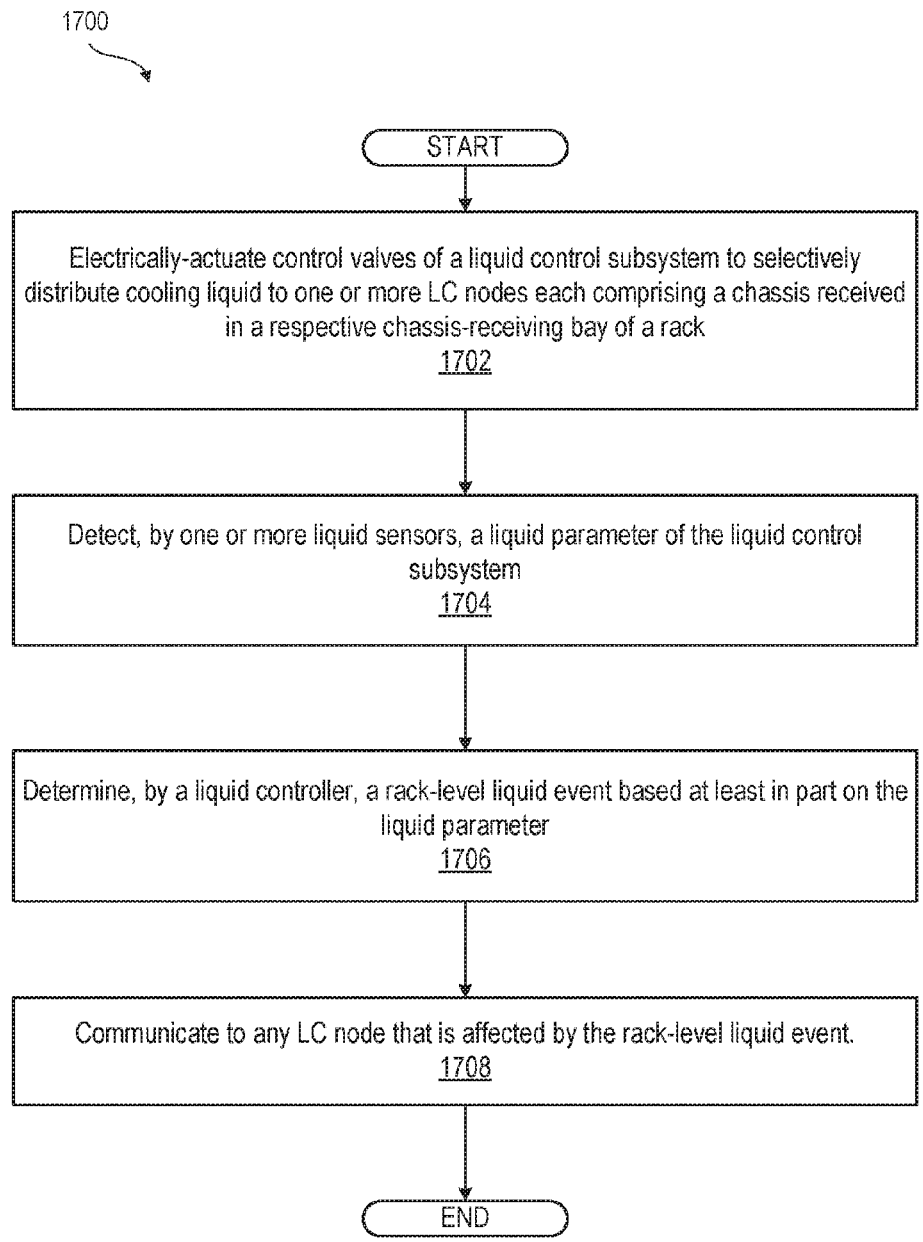
FIG. 17 illustrates a flow diagram of a method of managing rack-level liquid cooling events in a RIHS, according to one or more embodiments.

FIG. 17 illustrates a method 1700 of managing rack-level liquid cooling events in a RIHS. In one or more embodiments, the method 1700 includes electrically-actuating control valves of a liquid control subsystem to selectively distribute cooling liquid to one or more LC nodes each comprising a chassis received in a respective chassis-receiving bay of a rack (block 1702). The cooling liquid is received by a system of conduits of each LC node to regulate the ambient temperature of the LC node and to provide cooling to heat-generating functional components inside the LC node by removing heat generated by the functional components. The method 1700 includes detecting, by one or more liquid sensors, a parameter of the liquid control subsystem (block 1704). The method 1700 includes determining, by a liquid controller, a rack-level liquid event based at least in part on the parameter (block 1706). the method 1700 includes communicating to any LC node that is affected by the rack-level liquid event (block 1708).

Figure 18:
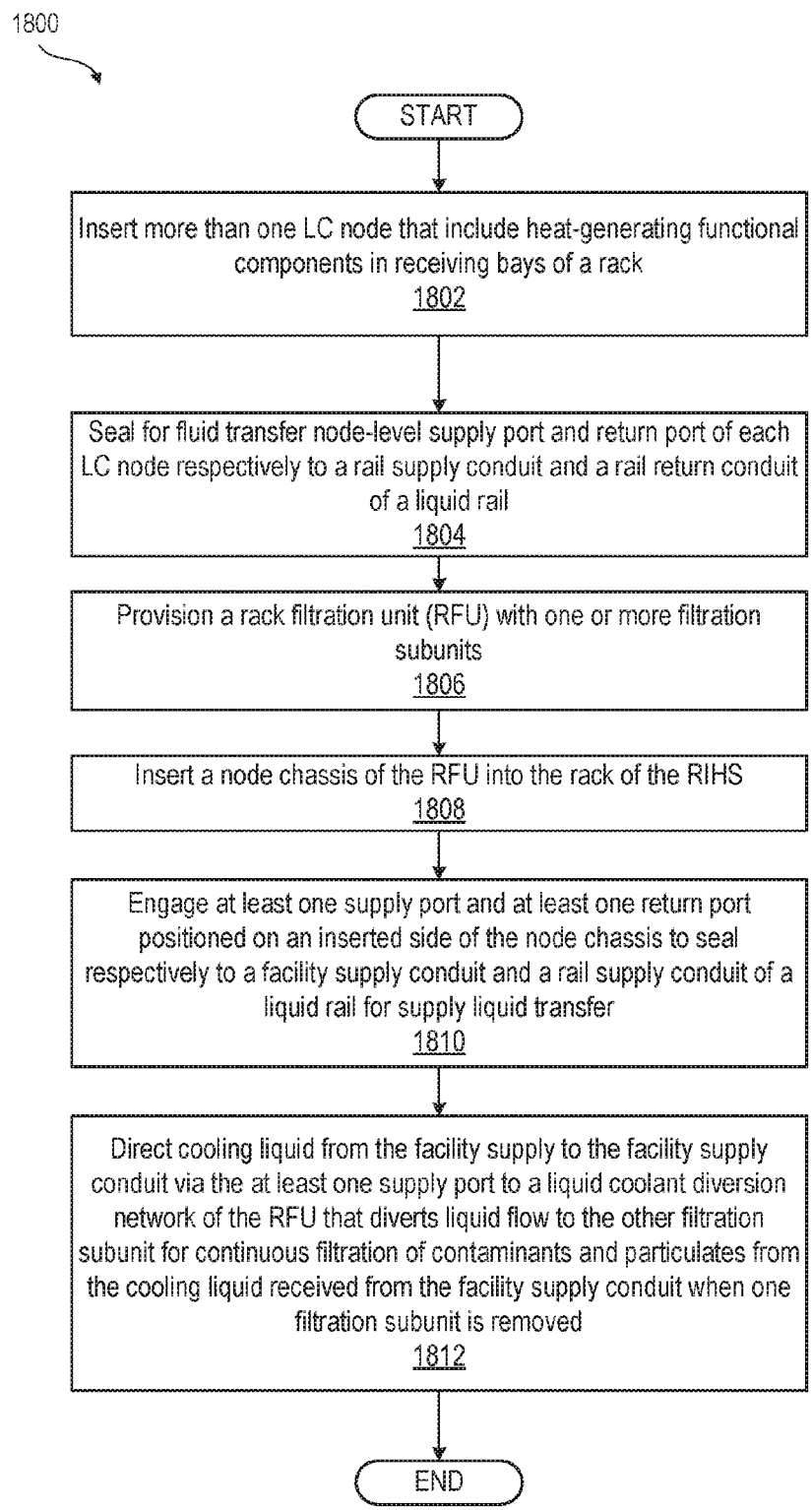
FIG. 18 illustrates a flow diagram of a method of providing a redundant dual filter module within a single node as a rack filtration unit (RFU) for continuous filtration of cooling liquid within the DL RIHS, according to one or more embodiments.

FIG. 18 illustrates a method 1800 of assembling a DL RIHS with an RFU. In one or more embodiments, the method 1800 includes inserting more than one LC node that include heat-generating functional components in receiving bays of a rack (block 1802). The method includes sealing for fluid transfer node-level supply port and return port of each LC node respectively to a rail supply conduit and a rail return conduit of a liquid rail (block 1804).

The method 1800 includes provisioning a rack filtration unit (RFU) with one or more filtration subunits (block 1806). In one or more embodiments, an RFU is provisioned with a first filtration subunit that is configured to filter particulates from the cooling liquid. A second filtration subunit is configured to filter contaminants from the cooling liquid. A liquid coolant diversion network is configured, such as by adding a jumper conduit, to divert liquid flow serially through the first and second filtration subunits. In one or more embodiments, the RIHS are provisioned with identical first and second filtration subunits connected in parallel fluid communication within the node chassis. Each filtration subunit is individually disengageable from the node chassis for maintenance or replacement, while the other filtration subunit remains engaged in the node chassis and continues liquid filtration. The method 1800 includes inserting a node chassis of the RFU into the rack of the RIHS (block 1808). The method 1800 includes engaging at least one supply port and at least one return port positioned on an inserted side of the node chassis to seal respectively to a facility supply conduit and a rail supply conduit of a liquid rail for supply liquid transfer (block 1810). The method includes directing cooling liquid from the facility supply to the facility supply conduit via the at least one supply port to a liquid coolant diversion network of the RFU that diverts liquid flow to the other filtration subunit for continuous filtration of contaminants and particulates from the cooling liquid received from the facility supply conduit when one filtration subunit is removed (block 1812)

Figure 19:
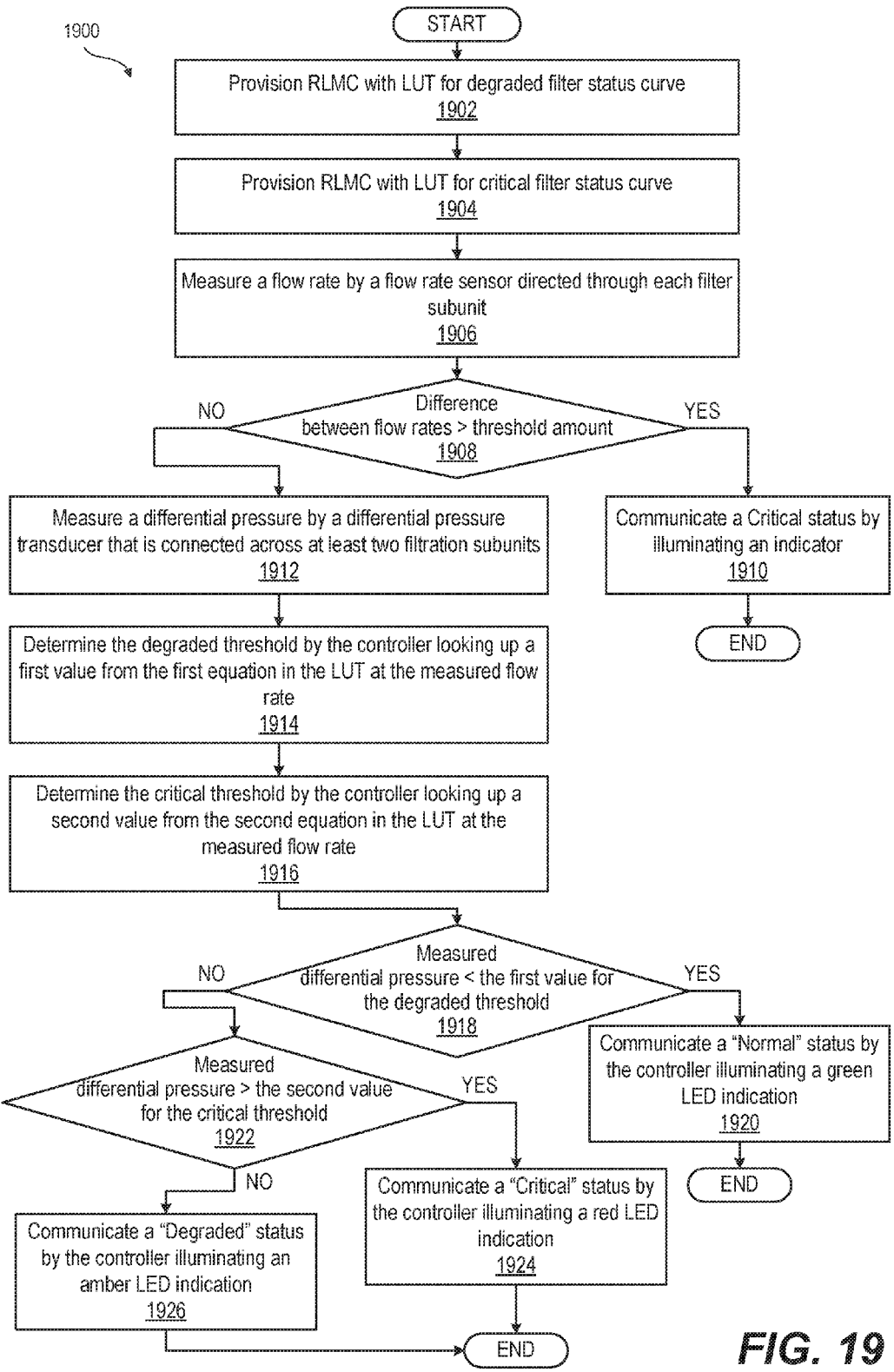
FIG. 19 illustrates a flow diagram of a method of monitoring performance of an RFU, according to one or more embodiments.

FIG. 19 illustrates a method 1900 of monitoring a filter of a rackmount appliance that performs server and rack liquid management and water control policy execution. In one or more embodiments, the method 1900 includes provisioning a Rack Liquid Management Controller (RLMC) with a lookup table (LUT) with values based on a first equation for a degraded filter status curve ("FilterXPressureDiffReading_Degraded"). The first equation is in the polynomial form $y=ax^2+bx+c$ (block 1902). In one or more embodiments, the values can also be calculated when needed. In an exemplary embodiment, the first equation for the degraded filter status curve uses the following coefficients: $y=0.02\ x^2+4\cdot10^{-15}\ x$. Other embodiments can have coefficients that are analytically or empirically derived for various configurations of filtration subunits and liquid cooling subsystems. Method 1900 includes provisioning the RLMC with an LUT with values based on a second equation for a critical filter status curve ("FilterXPressureDiffReading_Critical") that is in the polynomial form $y=dx^2+ex+f$ (block 1904). In an exemplary embodiment, the second equation for the critical filter status curve uses the following coefficients: $y=0.03\ x^2-4\cdot40^{-15}\ x+1\cdot10^{-14}$. The method 1900 includes measuring, by a flow rate sensor, a flow rate directed through each filter subunit (block 1906). The method 1900 includes determining whether the measured flow rate for each of the filtration subunits is comparatively different by at least a threshold amount, which indicates a localized blockage (decision block 1908). In response to determining in decision block 1908 that a selected one of the filtration subunits has a flow rate that is less than another filtration subunit by at least the threshold amount, the method 1900 includes communicating a degraded status (block 1910). Then method 1900 ends. In one embodiment, the degraded status is communicated by a controller illuminating an indicator, such as an amber or red LED.

In response to determining in decision block 1908 that a selected one of the filtration subunits does not have a flow rate that is less than another filtration subunit by at least the threshold amount, the method 1900 further includes measuring a differential pressure by a differential pressure transducer that is connected across the two filtration subunits (block 1912). The method includes determining the degraded threshold value by the controller. In one embodiment, the controller looks up a first value that is generated from the first equation and provisioned in the LUT. The first value corresponds to the measured flow rate (block 1914). The method 1900 includes determining a critical threshold by the controller looking up a second value from the second equation in the LUT at the measured flow rate (block 1916). The method 1900 includes determining by the controller that the measured differential pressure is less than the first value for the degraded threshold ("FilterXPressure DiffReading<FilterXPressureDiffReading_Degraded") (decision block 1918). In response to determining in decision block 1918 that the measured differential pressure is less than the first value for the degraded threshold, the method 1900 includes communicating a "Normal" status by the controller illuminating a green LED indication (block 1920). Method 1900 then ends. In response to determining at decision block 1918 that the measured differential pressure is not less than the first value for the degraded threshold, a determination is made by the controller whether the measured differential pressure is greater than the second value for the critical threshold ("FilterXPressure DiffReading>FilterXPressureDiffReading_Critical") (decision block 1922). In response to determining in decision block 1922 that the measured differential pressure is greater than the second value for the critical threshold, method 1900 includes communicating a "Critical" status. In one embodiment, the critical status is communicated by the controller illuminating a red LED (block 1924). In response to determining in decision block 1922 that the measured differential pressure is not greater than the second value for the critical threshold, method 1900 includes communicating a "Degraded" status. In one embodiment, the degraded status is communicated by the controller illuminating an amber LED indication (block 1926). The method 1900 then ends.

Figure 20:
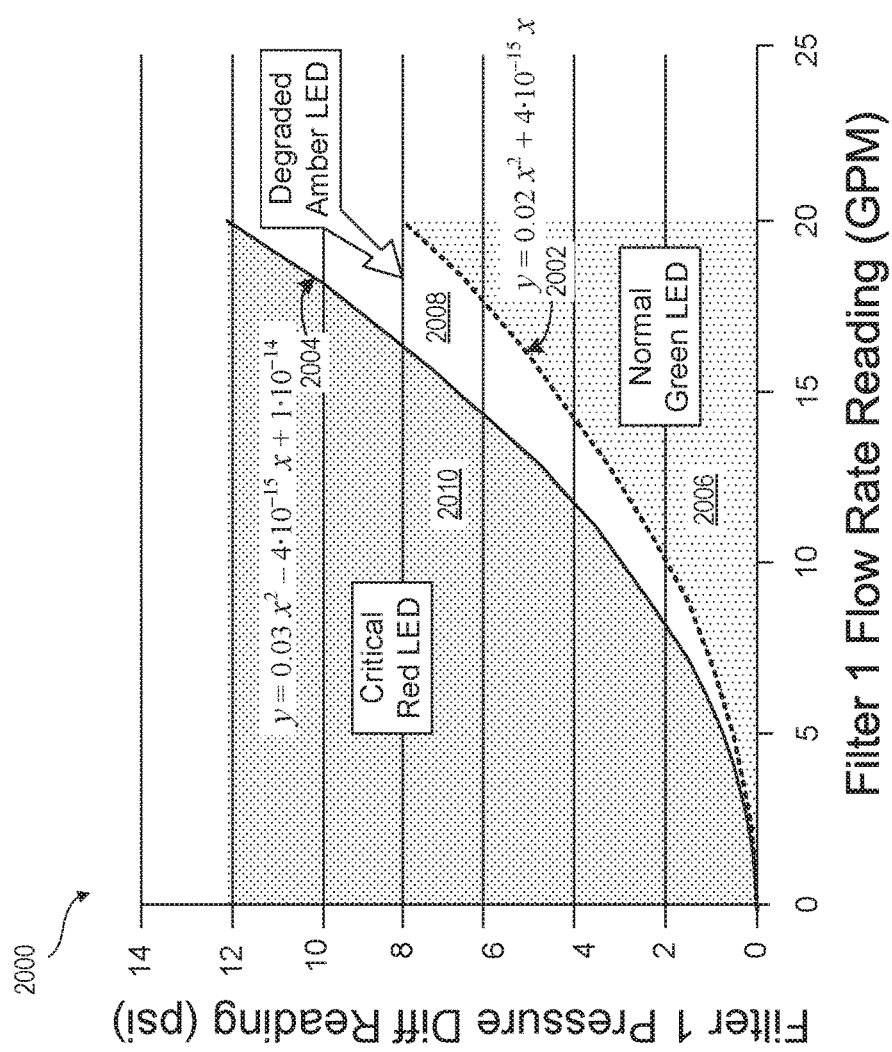
FIG. 20 illustrates a graphical plot of flow rate versus differential pressure for a filter of an RFU, according to one or more embodiment.

FIG. 20 illustrates an example graphical plot 2000 that represents the example thresholds utilized by method 1900 (FIG. 19) wherein the Degraded Filter status curve 2002, Filter1PressureDiffReading_Degraded=$ax^2+bx+c$ equation, is calculated using the following coefficients:

$$y=0.02x^2+4\cdot 10^{-15}x$$

and the Critical Filter status curve 2004, i.e., Filter1PressureDiffReading_Critical=$dx^2+ex+f$ equation, is calculated using the following coefficients:

$$y=0.03x^2-4\cdot 10^{-15}x+1\cdot 10^{-14}$$

Operating in an area 2006 to the right of the degraded filter status curve 2002 results in a Normal status with a green LED indication. Operating in an area 2008 between the two curves 2002, 2004 results in a Degraded status with an amber LED indication. The corresponding filtration sub-unit/s should be replaced before the status changes to critical. Operating in an area 2010 to the left of the critical filter status curve 2004 results in a Critical status with a red LED indication. Immediate replacement of the corresponding filtration subunit/s is thus required.

In the above described flow charts of FIGS. 17-19, one or more of the methods may be embodied in an automated manufacturing system or an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A Rack Information Handling System (RIHS) comprising:
 a rack having chassis-receiving bays;
 more than one liquid cooled (LC) node containing heat-generating functional components, each LC node configured with a system of conduits to receive cooling liquid to regulate the ambient temperature of the node and provide cooling to the functional components inside the node by removing heat generated by the heat-generating functional components;
 a liquid control subsystem comprising electrically-actuated control valves to selectively distribute cooling liquid to one or more LC node that each have a chassis received in a respective chassis-receiving bay of the rack;
 one or more liquid sensors to detect a parameter corresponding to a flow rate associated with the liquid control subsystem; and
 a liquid controller communicatively coupled to the electrically-actuated control valves and the one or more liquid sensors that determines a rack-level liquid event based at least in part on the parameter and communicates to any LC node that is affected by the rack-level liquid event.

2. The RIHS of claim 1, further comprising:
a rack filtration unit (RFU), which includes the liquid controller and further comprises:
   a node chassis insertable into the rack of the RIHS;
   a first filtration subunit that is configured to filter particulates from the cooling liquid;
   a second filtration subunit that is configured to filter contaminants from the cooling liquid;
   a liquid coolant diversion network that diverts liquid flow serially through the first and second filtration subunits; and
   at least one supply port and at least one return port positioned on an inserted side of the node chassis to seal respectively to a facility supply conduit and a rail supply conduit of a liquid rail for supply liquid transfer.

3. The RIHS of claim 1, further comprising:
a rack filtration unit (RFU), which includes the liquid controller and further comprises:
   a node chassis insertable into the rack of the RIHS;
   first and second filtration subunits connected in parallel fluid communication within the node chassis, wherein each filtration subunit is individually disengageable from the node chassis for maintenance or replacement, while the other filtration subunit remains engaged in the node chassis and continues liquid filtration;
   a liquid coolant diversion network that diverts liquid flow to the other filtration subunit for continuous filtration of contaminants and particulates from the cooling liquid received from the facility supply conduit when one filtration subunit is removed; and
   at least one supply port and at least one return port positioned on an inserted side of the node chassis to seal respectively to a facility supply conduit and a rail supply conduit of a liquid rail for supply liquid transfer.

4. The RIHS of claim 3, wherein:
the one or more liquid sensors comprise:
   a first flow rate sensor that detects a first flow rate of a first liquid flow to the first filtration subunit by the liquid coolant diversion network;
   a second flow rate sensor that detects a second flow rate of a second liquid flow to the second filtration subunit by the liquid coolant diversion network;
   a first and second differential pressure sensor that respectively detect a differential pressure value across the first and second filtration subunits; and
the liquid controller is communicatively coupled with at least one of (i) the first and second flow rate sensors and (ii) the differential pressure sensors to determine and communicate an operating status of the first and second filtration subunits based on one or more of (a) the first and second flow rates and (b) the differential pressure value from each differential pressure sensor.

5. The RIHS of claim 4, wherein the liquid controller of the RFU:
determines whether a selected one of the first and second flow rates is less than a next one of the flow rates by at least a threshold amount; and
in response to determining that the selected one of the first and second flow rates is less than the next flow rate by at least a threshold amount that is indicative of a localized blockage, communicates that the corresponding one of the first and second filtration subunits has a degraded status.

6. The RIHS of claim 5, wherein, for a selected one of the first and second filtration subunits, the liquid controller:
determines whether the measured differential pressure value is at least equal to a second threshold value that is greater than the first threshold value; and
in response to determining that the measured differential pressure value is at least equal to the second threshold, communicates that a corresponding one of the first and second filtration subunits has a critical status.

7. The RIHS of claim 6, further comprising:
at least one light indicator communicatively coupled to the liquid controller; and
wherein the liquid controller:
   communicates that the corresponding one of the first and second filtration subunits has a normal status by triggering the at least one light indicator to illuminate in a first color;
   communicates that the corresponding one of the first and second filtration subunits has a degraded status by the triggering the at least one light indicator to illuminate in a second color; and
   communicates that the corresponding one of the first and second filtration subunits has a critical status by the triggering the at least one light indicator to illuminate in a third color.

8. The RIHS of claim 4, wherein the liquid controller of the RFU:
for a selected one of the first and second filtration subunits, determines whether the measured differential pressure value is at least equal to a first threshold value associated with a corresponding one of the first and second flow rates; and
in response to determining that the measured differential pressure value is at least equal to the first threshold, communicates that the corresponding one of the first and second filtration subunits has a degraded status.

9. The RIHS of claim 3, wherein:
the RFU further comprises:
   an electrically-actuated purge valve in fluid communication with the liquid coolant diversion network; and
   a user input device that receives a user input; and
the liquid controller is communicatively coupled with the electrically-actuated purge valve and the user input device, and the liquid controller:
   receives the user input to the user input device; and
   in response to receiving the user input, actuates the electrically-actuated purge valve to release fluid pressure from a portion of the liquid coolant diversion network to facilitate removal of a selected one of the first and second filtration subunits.

10. The RIHS of claim 1, further comprising an auxiliary power source electrically coupled to the liquid controller to perform one of a diagnostic and a leak test of the liquid cooling subsystem with rack electrical power removed from the LC nodes.

11. The RIHS of claim 1, wherein the liquid controller:
performs a diagnostic test for each solenoid valve of the liquid cooling subsystem during activation of and prior to full power-on of the RIHS:
   commands a selected solenoid valve to one of an open and closed state;
   senses whether the selected solenoid valve is in the commanded state;
   commands the selected solenoid valve to the other of the open and closed state;
   senses whether the selected solenoid valve is in the other commanded state; and logs the sensed states of the selected solenoid valve.

12. The RIHS of claim 11, wherein the liquid controller performs the diagnostic test for each dynamic control valve of the liquid cooling system, wherein the liquid controller:
commands the selected dynamic control valve to one dynamic position in a range between open and closed;
senses a first flow rate of the selected dynamic control valve;
commands the selected dynamic control valve to another dynamic position in the range between open and closed;
senses a second flow rate of the selected dynamic control valve; and
logs the sensed first and second flow rates of the selected dynamic control valve.

13. The RIHS of claim 1, wherein:
the one or more liquid sensors comprise one or more liquid detection sensor positioned to respectively receive liquid that leaks from sealed connections or conduit runs of the liquid cooling subsystem; and
the liquid controller performs a leak test of the liquid cooling system, wherein the liquid controller:
opens all electrically-actuated control valves;
identifies whether any of the one or more liquid detection sensors detects liquid; and
logs a result of the leak test.

14. A method of managing rack-level liquid cooling events in a Rack Information Handling System (RIHS), the method comprising:
electrically-actuating control valves of a liquid control subsystem to selectively distribute cooling liquid to one or more liquid cooled (LC) nodes each comprising a chassis received in a respective chassis-receiving bay of a rack, wherein the cooling liquid is received by a system of conduits of each LC node to regulate the ambient temperature of the LC node and to provide cooling to heat-generating functional components inside the LC node by removing heat generated by the functional components;
detecting, by one or more liquid sensors, a parameter corresponding to a flow rate associated with the liquid control subsystem;
determining, by a liquid controller of the liquid control subsystem, a rack-level liquid event based at least in part on the parameter; and
communicating to any LC node that is affected by the rack-level liquid event.

15. The method of claim 14, wherein:
detecting, by the one or more liquid sensors, the parameter of the liquid control subsystem comprises:
detecting, by a first flow rate sensor, a first flow rate of a first liquid flow to a first filtration subunit of a rack filtration unit (RFU) by a liquid coolant diversion network;
detecting, by a second flow rate sensor, a second flow rate of a second liquid flow to a second filtration subunit of the RFU by the liquid coolant diversion network;
detecting, by first and second differential pressure sensors, a differential pressure value respectively across the first and second filtration subunits;
determining, by a liquid controller, an operating status of the first and second filtration subunits based on one or more of (i) the first and second flow rates and (ii) the differential pressure value from each differential pressure sensor; and
communicating the operating status.

16. The method of claim 15, further comprising:
determining, by the liquid controller, whether a selected one of the first and second flow rates is less than the other flow rate by at least a threshold amount; and
in response to determining that the selected one of the first and second flow rates is less than the other flow rate by at least a threshold amount that is indicative of a localized blockage, communicating, by the liquid controller, that the corresponding one of the first and second filtration subunits has a degraded status.

17. The method of claim 15, further comprising:
for a selected one of the first and second filtration subunits, determining whether the measured differential pressure value is at least equal to a first threshold value associated with a corresponding one of the first and second flow rates; and
in response to determining that the measured differential pressure value is at least equal to the first threshold, communicating that the corresponding one of the first and second filtration subunits has a degraded status.

18. The method of claim 17, further comprising:
determining for a selected one of the first and second filtration subunits whether the measured differential pressure value is at least equal to a second threshold value that is greater than the first threshold value; and
in response to determining that the measured differential pressure value is at least equal to the second threshold, communicating that a corresponding one of the first and second filtration subunits has a critical status.

19. The method of claim 18, further comprising:
communicating that the corresponding one of the first and second filtration subunits has a normal status by triggering the at least one light indicator to illuminate in a first color;
communicating that the corresponding one of the first and second filtration subunits has a degraded status by the triggering the at least one light indicator to illuminate in a second color; and
communicating that the corresponding one of the first and second filtration subunits has a critical status by the triggering the at least one light indicator to illuminate in a third color.

20. The method of claim 15, further comprising:
receiving a user input to a user input device; and
in response to receiving the user input, actuating an electrically-actuated purge valve to release fluid pressure from a portion of the liquid coolant diversion network to facilitate removal of a selected one of the first and second filtration subunits.

21. The method of claim 15, further comprising performing a diagnostic test for each solenoid valve of the liquid cooling subsystem during activation of and prior to full power-on of the RIHS by:
commanding a selected solenoid valve to one of an open and closed state;
sensing whether the selected solenoid valve is in the commanded state;
commanding the selected solenoid valve to the other of the open and closed state;
sensing whether the selected solenoid valve is in the other commanded state; and
logging the sensed states of the selected solenoid valve.

22. The method of claim 15, further performing a diagnostic test for each dynamic control valve of the liquid cooling system by:
commanding the selected dynamic control valve to one dynamic position in a range between open and closed;

sensing a first flow rate of the selected dynamic control valve;

commanding the selected dynamic control valve to another dynamic position in the range between open and closed;

sensing a second flow rate of the selected dynamic control valve; and logging the sensed first and second flow rates of the selected dynamic control valve.

23. The method of claim 15, performing a leak test of the liquid cooling system by:

opening all electrically-actuated control valves;

identifying whether any of one or more liquid detection sensors positioned to respectively receive liquid that leaks from sealed connections or conduit runs of the liquid cooling subsystem detects liquid senses a presence of liquid.

* * * * *